United States Patent
Niwa

(10) Patent No.: US 11,490,045 B2
(45) Date of Patent: Nov. 1, 2022

(54) SOLID-STATE IMAGING DEVICE

(71) Applicant: Sony Semiconductor Solutions Corporation, Kanagawa (JP)

(72) Inventor: Atsumi Niwa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/378,637

(22) Filed: Jul. 16, 2021

(65) Prior Publication Data

US 2021/0344863 A1    Nov. 4, 2021

Related U.S. Application Data

(63) Continuation of application No. 17/084,583, filed on Oct. 29, 2020, which is a continuation of application
(Continued)

(30) Foreign Application Priority Data

Oct. 30, 2017   (JP) .................................. 2017-209045

(51) Int. Cl.
*H04N 5/369* (2011.01)
*H04N 5/3745* (2011.01)
*H01L 27/146* (2006.01)

(52) U.S. Cl.
CPC ......... *H04N 5/379* (2018.08); *H04N 5/36961* (2018.08); *H04N 5/37455* (2013.01); *H01L 27/14634* (2013.01)

(58) Field of Classification Search
CPC ............... H04N 5/379; H04N 5/36961; H04N 5/37455; H04N 5/3745; H01L 27/14634; H01L 27/14607
See application file for complete search history.

(56) References Cited

U.S. PATENT DOCUMENTS 10,992,887 B2 * 4/2021 Movshovich ........ H04N 5/3454
11,140,349 B2 * 10/2021 Suh ....................... H04N 5/378
(Continued)

FOREIGN PATENT DOCUMENTS

| CN | 104272723 A | 1/2015 |
| CN | 104425533 A | 3/2015 |

(Continued)

OTHER PUBLICATIONS

International Search Report and English translation thereof dated Oct. 9, 2018 in connection with International Application No. PCT/JP2018/026757.
(Continued)

*Primary Examiner* — Mekonnen D Dagnew
(74) *Attorney, Agent, or Firm* — Wolf, Greenfield & Sacks, P.C.

(57) ABSTRACT

A mounting area in a solid-state imaging device that detects an address event. The solid-state imaging device includes a light receiving chip and a detection chip. In the solid-state imaging device including the light receiving chip and the detection chip, the light receiving chip includes a photodiode that photoelectrically converts incident light and generates a photocurrent. In addition, the solid-state imaging device, the detection chip quantizes a voltage signal corresponding to the photocurrent generated by the photodiode in the light receiving chip and outputs the voltage signal as a detection signal.

18 Claims, 29 Drawing Sheets

Related U.S. Application Data

No. 16/484,946, filed as application No. PCT/JP2018/026757 on Jul. 17, 2018, now Pat. No. 11,082,656.

(56) References Cited

U.S. PATENT DOCUMENTS

| | | |
|---|---|---|
| 2009/0251576 A1 | 10/2009 | Hattori et al. |
| 2009/0284632 A1 | 11/2009 | Onuki et al. |
| 2014/0009648 A1* | 1/2014 | Kim .................. H04N 5/232411 |
| | | 348/272 |
| 2016/0093273 A1* | 3/2016 | Wang ...................... G01S 3/781 |
| | | 345/428 |
| 2017/0018587 A1 | 1/2017 | Ohmaru |
| 2018/0175086 A1 | 6/2018 | Ohmaru |
| 2020/0084403 A1 | 3/2020 | Suh et al. |
| 2020/0260039 A1 | 8/2020 | Niwa |
| 2021/0051288 A1 | 2/2021 | Niwa |

FOREIGN PATENT DOCUMENTS

| | | |
|---|---|---|
| CN | 104683712 A | 6/2015 |
| CN | 105393356 A | 3/2016 |
| CN | 106169492 A | 11/2016 |
| CN | 208707784 U | 4/2019 |
| JP | 4271909 B2 | 6/2009 |
| JP | 2013009294 A | 1/2013 |
| JP | 2015501936 A | 1/2015 |
| JP | 2016-533140 A | 10/2016 |
| JP | 2017-028690 A | 2/2017 |
| JP | 2017-103544 A | 6/2017 |
| KR | 20140103116 A | 8/2014 |
| WO | WO 2015/036592 A1 | 3/2015 |
| WO | WO-2016152577 A1 | 9/2016 |
| WO | WO 2017/009944 A1 | 1/2017 |
| WO | WO 2017/098725 A1 | 6/2017 |

OTHER PUBLICATIONS

International Written Opinion dated Oct. 9, 2018 in connection with International Application No. PCT/JP2018/026757, and English translation thereof.
International Preliminary Report on Patentability dated May 14, 2020 in connection with International Application No. PCT/JP2018/026757, and English translation thereof.
Extended European Search Report dated Feb. 24, 2020 in connection with European Application No. 18872485.0.
Chinese Office Action dated Sep. 1, 2020 in connection with Chinese Application No. 201810966043.3, and English translation thereof.

* cited by examiner

SOLID-STATE IMAGING DEVICE

CROSS-REFERENCE TO RELATED APPLICATIONS

The present application claims the benefit under 35 U.S.C. § 120 as a continuation application of U.S. application Ser. No. 17/084,583, filed on Oct. 29, 2020, which claims the benefit under 35 U.S.C. § 120 as a continuation application of U.S. application Ser. No. 16/484,946, filed on Aug. 9, 2019, which claims the benefit under 35 U.S.C. 371 as a U.S. National Stage Entry of International Application No, PCT/JP2018/02675/, filed in the Japanese Patent Office as a Receiving Office on Jul. 17, 2018, which claims priority to Japanese Patent Application Number JP2017-209045, filed in the Japanese Patent Office on Oct. 30, 2017, each of which applications is hereby incorporated by reference in its entirety.

TECHNICAL FIELD

The present technology relates to a solid-state imaging device and more particularly, to a solid-state imaging device that compares an amount of incident light with a threshold.

BACKGROUND ART

In the related art, a synchronous type solid-state imaging device that synchronizes a synchronous signal such as a vertical synchronizing signal and images image data (frame) has been used in an imaging apparatus or the like. This typical synchronous type solid-state imaging device acquires the image data only for each period of the synchronizing sighai (e.g., 1/60 sec.). It becomes therefore difficult to correspond to the case that faster processing is needed in the field with respect to traffic, a robot, or the like. Accordingly, an asynchronous type solid-state imaging device including an address event detection circuit arranged for each pixel has been proposed (for example, see Patent Literature 1). The address event detection circuit detects in real time as an address event that an amount of light of the pixel exceeds a threshold for each pixel address.

CITATION LIST

Patent Literature

Patent Literature 1: Translation of PCT International Application Publication No. 2016-533140

DISCLOSURE OF INVENTION

Technical Problem

The above-described asynchronous type solid-state imaging device can generate and output data much faster than the synchronous type solid-state imaging device. Thus, it is possible to perform fast image recognition processing on a human or an obstacle and improve safety in the traffic field, for example. However, the address event detection circuit has a circuit scale larger than that of a pixel circuit of the synchronous type. If such a circuit is arranged for each pixel, there is a problem that a mounting area may increase as compared with that of the synchronous type.

The present technology is made in view of the above-mentioned circumstances, and it is an object of the present technology to reduce a mounting area in a solid-state imaging device that detects an address event.

Solution to Problem

The present technology is made to solve the above-described problem, a first aspect is a solid-state imaging device, including: a row drive circuit; a column drive circuit; and a plurality of pixels, each of the plurality of pixels including a photodiode that photoelectrically converts incident light and generates a photocurrent, a pixel circuit that quantizes a voltage signal corresponding to the photocurrent and outputs a quantized voltage signal as a detection signal, and a connection section, the row drive circuit and the column drive circuit being arranged on a second chip, the photodiode being arranged on a first chip, at least a part of the pixel circuit being arranged on the second chip and being electrically connected to the photodiode arranged on the first chip via the connection section. This provides a function to dispersedly arrange the circuits on the first chip and the second chip.

In addition, in the first aspect, in the pixel circuit, a plurality of N-type transistors that converts the photocurrent into the voltage signal and outputs the voltage signal may be further arranged on the first chip, and a P-type transistor that feeds a constant current to any of the plurality of N-type transistors may be further arranged on the second chip. This provides a function to arrange the N-type transistor and the photodiode on the same chip.

In addition, in the first aspect, in the pixel circuit, a current voltage conversion circuit that converts the photocurrent into the voltage signal may be further arranged on the second chip. This provides a function to reduce the circuit scale of the first chip for the current voltage conversion circuit.

In addition, in the first aspect, the current voltage conversion circuit may include an N-type transistor having a drain connected to a cathode of the photodiode and a gate and a source commonly connected to a power source, and may be the N-type. A use of only N-type transistor provides a function to convert the photocurrent into the voltage signal.

In addition, in the first aspect, the current voltage conversion circuit may include a diode having an anode connected to a cathode of the photodiode and a cathode connected to a power source, and a connection point of the diode and the photodiode may be connected to an input terminal of the buffer. A use of the diode provides a function to convert the photocurrent into the voltage signal.

In addition, in the first aspect, the current voltage conversion circuit may include a first N-type transistor having a gate to which a predetermined bias voltage is applied and a drain connected to a cathode of the photodiode, and a second N-type transistor having a gate connected to a connection point of the photodiode and the first transistor, a drain connected to a source of the first N-type transistor, and a source grounded, and a connection point of the first and second transistors may be connected to an input terminal of The buffer. The circuit including a gate ground circuit provides a function to suppress low frequency noise.

In addition, in the first aspect, the current voltage conversion circuit may include multiple stage loop circuits, and each of the multiple stage loop circuits includes a first N-type transistor and a second N-type transistor having a gate connected to a source of the first N-type transistor and a drain connected to a gate of the first N-type transistor. The multiple stage loop circuits provide a function to convert the photocurrent into the voltage signal with a high gain.

In addition, in the first aspect, in the pixel circuit, a current voltage conversion circuit that converts the photocurrent into the voltage signal and a buffer that corrects and outputs the voltage signal may be further arranged on the first chip. This provides a function to reduce the circuit scale of the second chip for the current voltage conversion circuit and the buffer.

In addition, in the first aspect, in the pixel circuit, a first capacitor having one end connected to an output terminal of the buffer is further arranged on the first chip, and an inverter having an input terminal connected to another terminal of the first capacitor and a second capacitor connected to the inverter in parallel are further arranged on the second chip. This provides a function to dispersedly arrange the first capacitor and the second capacitor on the first chip and the second chip.

In addition, in the first aspect, in the pixel circuit, a subtractor that lowers a level of the voltage signal output from the buffer and a quantize that quantizes the lowered voltage signal and outputs a quantized lowered voltage signal as the detection sighai may be further arranged on the first chip. This provides a function to reduce the circuit scale of the second chip for the subtractor and the quantizer.

Further, a second aspect of the present technology is a solid-state imaging device, including: a light receiving chip on which a photodiode that photoelectrically converts incident light and generates a photocurrent is arranged; and a detection chip that quantizes a voltage signal corresponding to the photocurrent and outputs a quantized voltage signal as a detection signal. This provides a function to dispersedly arrange the circuits on the light receiving chip and the detection chip.

In addition, in the second aspect, a plurality of N-type transistors that converts and outputs the photocurrent into the voltage signal may be further arranged on she light receiving chip, and a P-type transistor that feeds a constant current to any of the plurality of N-type transistors may be further arranged on the detection chip. This provides a function to arrange the N-type transistor and the photodiode on the same chip.

In addition, in the second aspect, a current voltage conversion circuit that converts the photocurrent into the voltage signal may be further arranged on the detection chip. This provides a function to reduce the circuit scale of the first chip for the current voltage conversion circuit.

In addition, in the second aspect, the current voltage conversion circuit may include an N-type transistor having a drain connected to a cathode of the photodiode and a gate and a source commonly connected to a power source, and a connection point of the N-type transistor and the photodiode may be connected to an input terminal of the buffer. A use of only N-type transistor provides a function to convert the photocurrent into the voltage signal.

In addition, in the second aspect, the current voltage conversion circuit may include a diode having an anode connected to a cathode of the photodiode and a cathode connected to a power source, and a connection point of the diode and the photodiode may be connected to an input terminal of the buffer. A use of the diode provides a function to convert the photocurrent into the voltage signal.

In addition, in the second aspect, the current voltage conversion circuit may include a first N-type transistor having a gate to which a predetermined bias voltage is applied and a drain connected to a cathode of the photodiode, and a second N-type transistor having a gate connected so a connection point of the photodiode and the first transistor, a drain connected to a source of the first N-type transistor, and a source grounded, and a connection point of the first and second transistors may be connected to an input terminal of the buffer. The circuit including a gate ground circuit provides a function to suppress the low frequency noise.

In addition, in the second aspect, the current voltage conversion circuit may include multiple stage loop circuits, and each of the multiple stage loop circuits includes a first N-type transistor and a second N-type transistor having a gate connected to a source of the first N-type transistor and a drain connected to a gate of the first N-type transistor. The multiple stage loop circuits provide a function to convert the photocurrent into the voltage signal with a high gain.

In addition, in the second aspect, a current voltage conversion circuit that converts the photocurrent into the voltage signal and a buffer that corrects and outputs the voltage signal may be further arranged on the light receiving chip. This provides a function to reduce the circuit scale of the detection chip for the current voltage conversion circuit.

In addition, in the second aspect, a first capacitor having one end connected to an output terminal of the buffer may be further arranged on the light receiving chip, and an inverter having an input terminal connected to another terminal of the first capacitor and a second capacitor connected to the inverter in parallel may be further arranged on the detection chip. This provides a function to dispersedly arrange the first capacitor and the second capacitor on the first chip and the second chip.

In addition, in the second aspect, a subtractor that lowers a level of the voltage signal output from the buffer and a quantizer that quantizes the lowered voltage signal and outputs a slant quantized lowered voltage signal as the detection signal may be further arranged on the light receiving chip. This provides a function to reduce the circuit scale of the detection chip for the subtractor and the quantizer.

In addition, in the second aspect, the solid-state imaging device may further include a signal processing chip that processes the detection signal. This provides a function to dispersedly arrange the circuits on light receiving chip, the detection chip, and the signal processing chip.

In addition, in the second aspect, a light receiving section on which a predetermined number of photodiodes are arrayed in a two-dimensional lattice may be arranged on she light receiving chip, an address event detection circuit that outputs the detection signal may be arranged on the detection chip, and the address event detection circuit may be commonly connected to a plurality of photodiodes adjacent within the light receiving section. This provides a function to share the address event detection circuit by the plurality of pixels.

In addition, in the second aspect, a multiplexer that selects any of the photocurrents from the plurality of photodiodes and feeds the photocurrent to the address event detection circuit may be further arranged on the detection chip. This provides a function to reduce a circuit scale of the light receiving chip for the multiplexer.

In addition, in the second aspect, a multiplexer that selects any of the photocurrents from the plurality of photodiodes and feeds the photocurrent to the address event detection circuit may be further arranged on the light receiving chip. This provides a function to reduce the circuit scale of the light receiving chip for the multiplexer.

In addition, in the second aspect, the solid-state imaging device may further includes a shield arranged between the light receiving chip and the detection chip. The provides a function to suppress electromagnetic noise.

In addition, in the second aspect, the photodiode may be arranged on each of a normal pixel and a phase difference pixel, and a part of the photodiode of the phase difference pixel may be light-shielded. This provides a function to detect the phase difference.

In addition, in the second aspect, a predetermined number of the photodiodes arrayed in a two-dimensional lattice and a current voltage conversion circuit that converts the photocurrent into the voltage signal may be arranged on the light receiving chip, and a plurality of photodiodes adjacent of the predetermined number of photodiodes may be commonly connected to the current voltage conversion circuit. This provides a function to share the current voltage conversion circuit by the plurality of pixels.

In addition, in the second aspect, a quantizer that compares the voltage signal with a plurality of threshold voltages and outputs a signal of a plurality of bits showing a compared result as the detection signal may be arranged on the detection chip. This provides a function to generate the image data having the detection signal of a plurality of bits.

Advantageous Effects of Invention

The present technology can exhibit an excellent effect that a mounting area is reduced in a solid-state imaging device that detects an address event. It should be noted that the effects described here are not necessarily limitative and may be any of effects described in the present disclosure.

MODE(S) FOR CARRYING OUT THE INVENTION

Hereinafter, modes for carrying out the present technology (hereinafter, referred to as embodiments) will be described. A description will be given in the following order.
1. First embodiment (example of arranging photodiodes on light receiving chip)

2. Second embodiment (example of arranging photodiodes, current voltage conversion circuit, and buffer on light receiving chip)
3. Third embodiment (example of arranging photodiodes on light receiving chip and arranging one N-type transistor in current voltage conversion circuit)
4. Fourth embodiment (example of arranging photodiodes on light receiving chip and arranging diode in current voltage conversion circuit)
5. Fifth embodiment (example of arranging photodiodes on light receiving chip and arranging gate ground circuit in current voltage conversion circuit)
6. Sixth embodiment (example of arranging photodiodes on light receiving chip and arranging dual loop circuits in current voltage conversion circuit)
7. Seventh embodiment (example of arranging photodiodes on light receiving chip and arranging the rests on detection chip and signal processing chip)
8. Eighth embodiment (example of arranging photodiodes on light receiving chip and sharing address event detection circuit by a plurality of pixels)
9. Ninth embodiment (example of arranging photodiodes on light receiving chip and arranging shields between light receiving chip and detection chip)
10. Tenth embodiment (example of arranging photodiodes on each of normal pixel and phase difference pixel in light receiving chip)
11. Eleventh embodiment (example of arranging photodiodes on light receiving chip and sharing current voltage conversion circuit by a plurality of pixels)
12. Twelfth embodiment (example of arranging photodiodes on light receiving chip and comparing voltage signal with a plurality of threshold voltages)
13. Application example for mobile body

1. FIRST EMBODIMENT

Configuration Example of Imaging Apparatus

Figure 1:
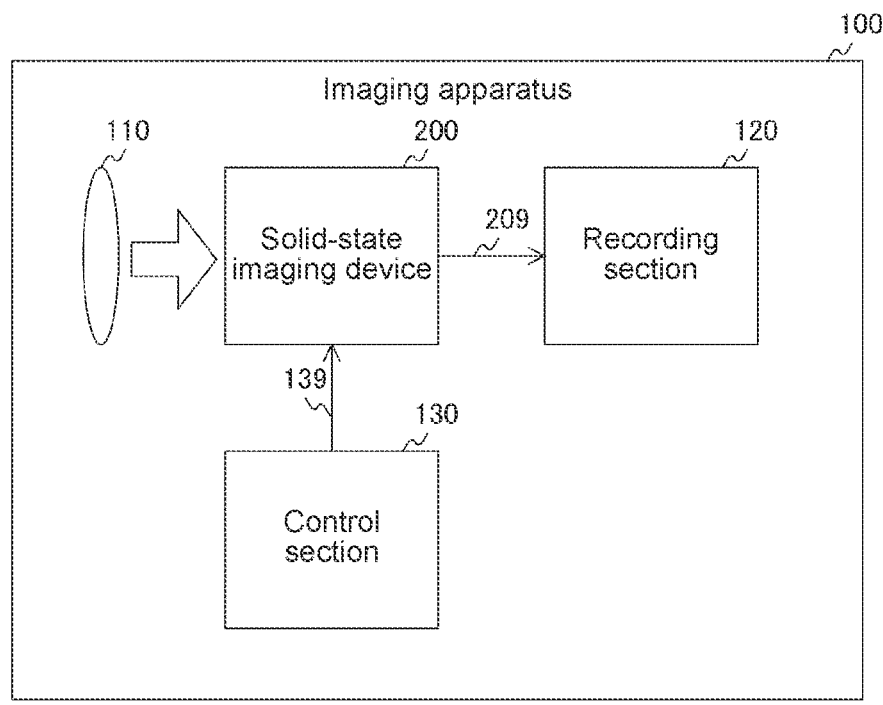
FIG. 1 A block diagram depicting one configuration example of an imaging apparatus according to a first embodiment of the present technology.

FIG. 1 is a block diagram depicting one configuration example of an imaging apparatus 100 according to a first embodiment of the present technology. The imaging apparatus 100 includes an imaging lens 110, a solid-state imaging device 200, a recording section 120, and a control section 130. As the imaging apparatus 100, a camera mounted to an industrial robot, a vehicle-mounted camera, or the like is assumed.

The imaging lens 110 collects incident light toward the solid-state imaging device 200. The solid-state imaging device 200 photoelectrically converts the incident light and images image data. The solid-state imaging device 200 executes predetermined single processing such as image recognition processing on the image data imaged and outputs the data processed to the recording section 120 via a signal line 209.

The recording section 120 records the data from the solid-state imaging device 200. The control section 130 controls the solid-state imaging device 200 and allows the image data to be imaged.

Configuration Example of Solid-State Imaging Device

Figure 2:
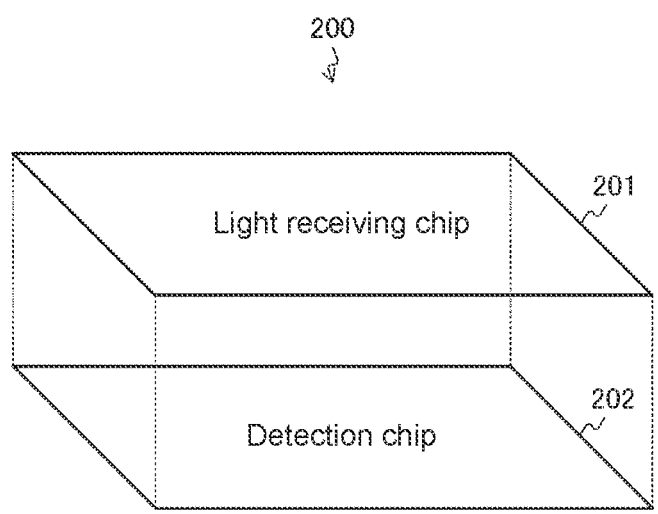
FIG. 2 A view depicting an example of a lamination structure of a solid-state imaging device according to the first embodiment of the present technology.

FIG. 2 is a view depicting an example of a lamination structure of the solid-state imaging device 200 according to the first embodiment of she present technology. The solid-state imaging device 200 includes a detection chip 202 and a light receiving chip 201 laminated on the detection chip 202. These chips are electrically connected. through a connection section such as a via. Incidentally, the chips may be connected by a Cu—Cu bonding or a bump other than the via. Note that the light receiving chip 201 an example of the claimed first chip and the detection chip 202 is an example of the claimed second chip.

Figure 3:
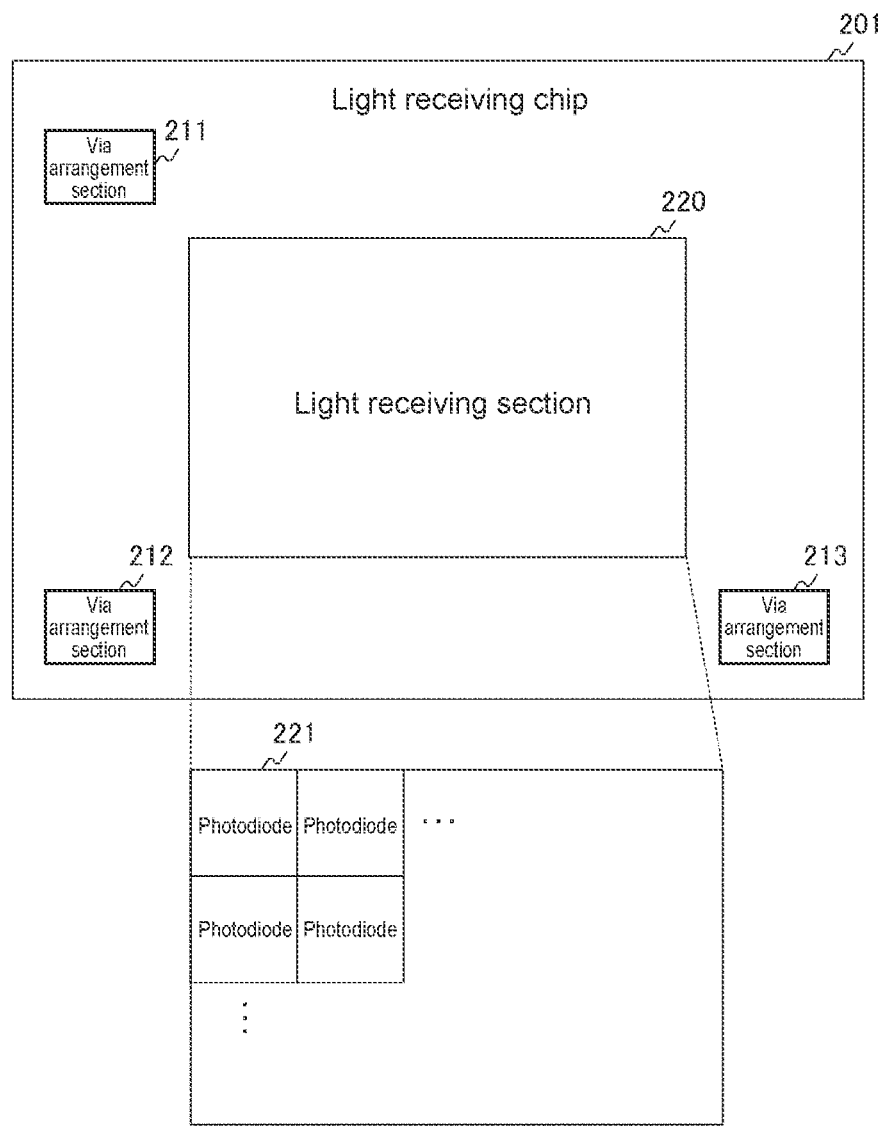
FIG. 3 An example of a plan view of a light receiving chip according to the first embodiment of the present technology.

FIG. 3 is an example of a plan view of the light receiving chip 201 according to the first embodiment of the present technology. The light receiving chip 201 includes a light receiving section 220 and via arrangement sections 211, 212, and 213.

Vias being connected to the detection chip 202 are arranged in the via arrangement sections 211, 212, and 213. In addition, a plurality of photodiodes 221 is arrayed in a two-dimensional lattice on the light receiving section 220. Each photodiode 221 photoelectrically converts the incident light and generates a photocurrent. A pixel address specified by a row address and a column address is assigned to each photodiode 221, which is treated as a pixel.

Figure 4:
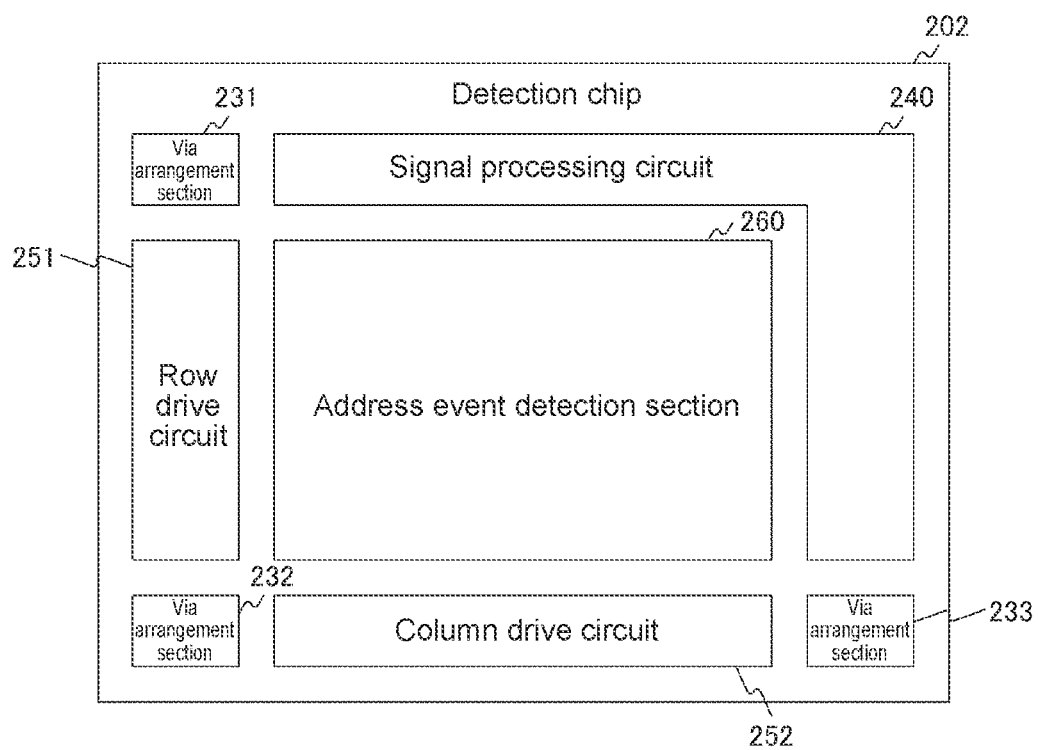
FIG. 4 An example of a plan view of a detection chip according to the first embodiment of the present technology.

FIG. 4 is an example of a plan view of the detection chip 202 according to the first embodiment of the present technology. The detection chip 202 includes via arrangement sections 231, 232, and 233, a signal processing circuit 240, a row drive circuit 251, a column drive circuit 252, and an address event detection section 260. Vias being connected to the light receiving chip 201 are arranged in the via arrangement sections 231, 232, and 233.

The address event detection section 260 generates a detection signal from the photocurrent of each of the plurality of photodiodes 221 and outputs the detection signal to the signal processing circuit 240. The detection signal is a 1-bit signal showing whether or not it detects as an address event that an amount of incident light exceeds a predetermined threshold.

The row drive circuit 251 selects the row address and allows the detection signal corresponding to the row address to be output to the address event detection section 260.

The column drive circuit 252 selects the column address and allows the detection signal corresponding to the column address to be output to the address event detection section 260.

The signal processing circuit 240 executes predetermined signal processing on the detection signal from the address event detection section 260. The signal processing circuit 240 arrays the detection signal in a two-dimensional lattice as the pixel signal and acquires the image data including 1-bit information for each pixel. Then, the signal processing circuit 240 executes the signal processing such as the image recognition processing on the image data.

Figure 5:
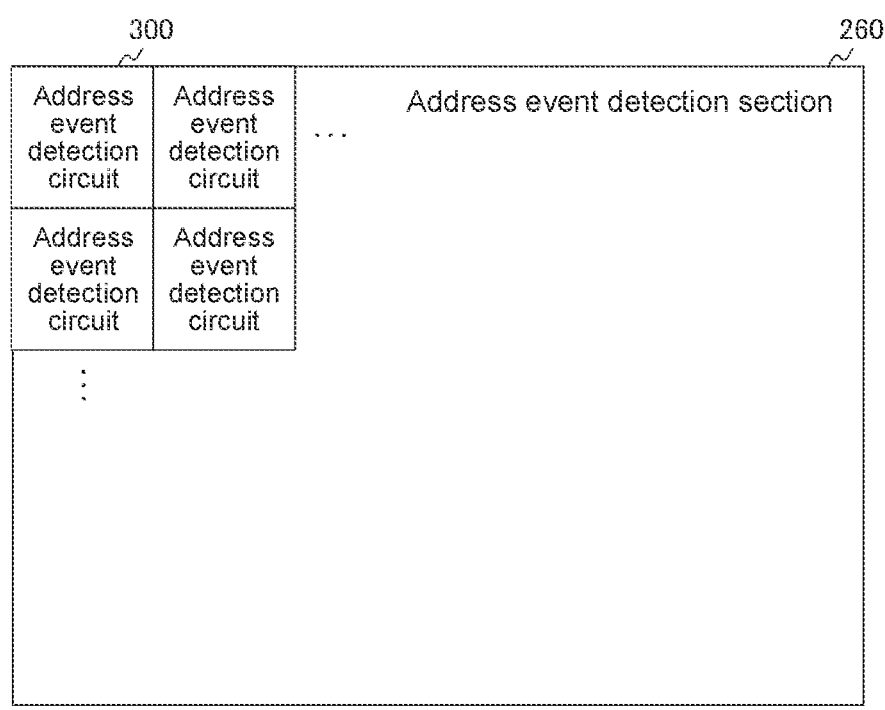
FIG. 5 An example of a plan view of an address event detection section according to the first embodiment of the present technology.

FIG. 5 is an example of a plan view of the address event detection section 260 according to the first embodiment of the present technology. A plurality of address event detection circuits 300 is arrayed on the address event detection section 260 in a two-dimensional lattice. Each pixel address is assigned to each address event detection circuits 300 and each pixel and each photodiode 221 having the same address are connected.

An address event detection circuit 300 quantizes a voltage signal corresponding to the photocurrent from the corresponding photodiode 221 and outputs the voltage signal as the detection signal.

Configuration Example of Address Event Detection Circuit

Figure 6:
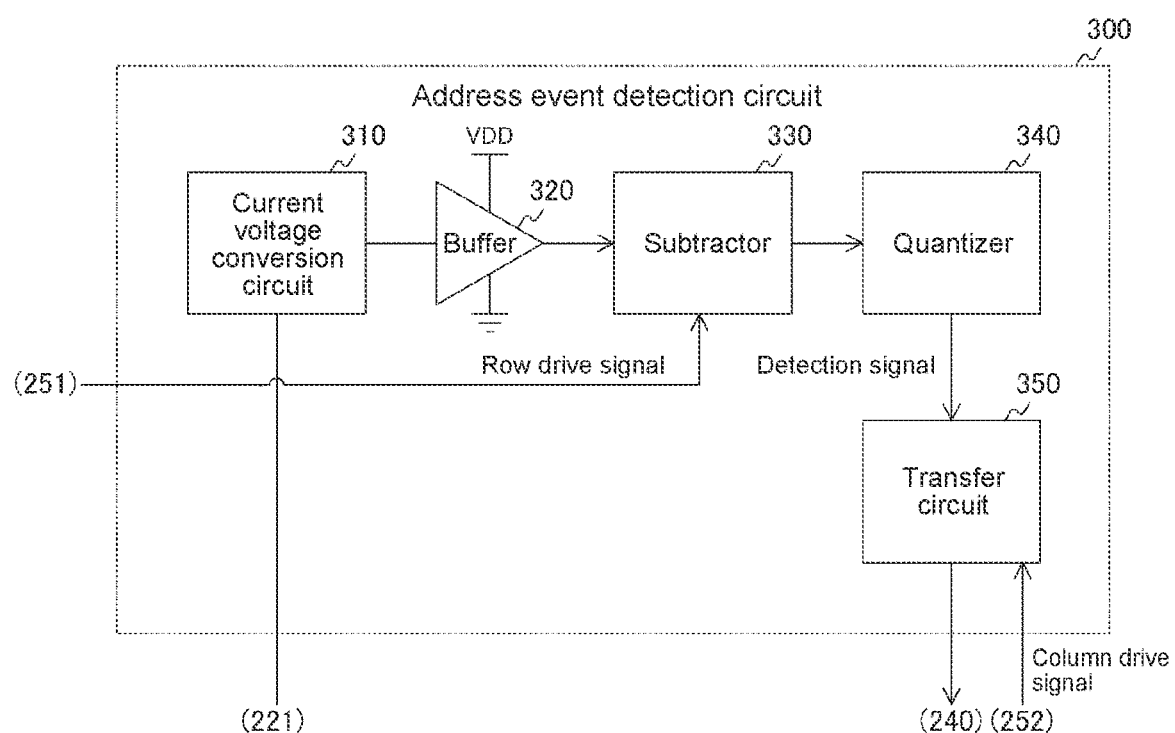
FIG. 6 A block diagram depicting one configuration example of the address event detection circuit according to the first embodiment of the present technology FIG. 7 A circuit diagram depicting one configuration example of a current voltage conversion circuit according to the first embodiment of the present technology.

FIG. 6 is a block diagram depicting one configuration example of the address event detection circuit 300 according to the first embodiment of the present technology. The address event detection circuit 300 includes a current voltage conversion circuit 310, a buffer 320, a subtractor 330, a quantizer 340, and a transfer circuit 350.

The current voltage conversion circuit 310 converts the photocurrent from the corresponding photodiode 221 into the voltage signal. The current voltage conversion circuit 310 feeds the voltage signal to the buffer 320.

The buffer 320 corrects the voltage signal from the current voltage conversion circuit 310. The buffer 320 outputs a corrected voltage signal to the subtractor 330.

The subtractor 330 lowers a level of the voltage signal from the buffer 320 in accordance with a row drive signal from the row drive circuit 251. The subtractor 330 feeds a lowered voltage signal to the quantizer 340.

The quantizer 310 quantizes the voltage signal from the subtractor 330 to a digital signal and outputs the digital signal to the transfer circuit 350 as the detection signal.

The transfer circuit 350 transfers the detection signal from the quantizer 340 to the signal processing circuit 240 in accordance with a column drive signal from the column drive circuit 252.

Configuration Example of Current Voltage Conversion Circuit

Figure 7:
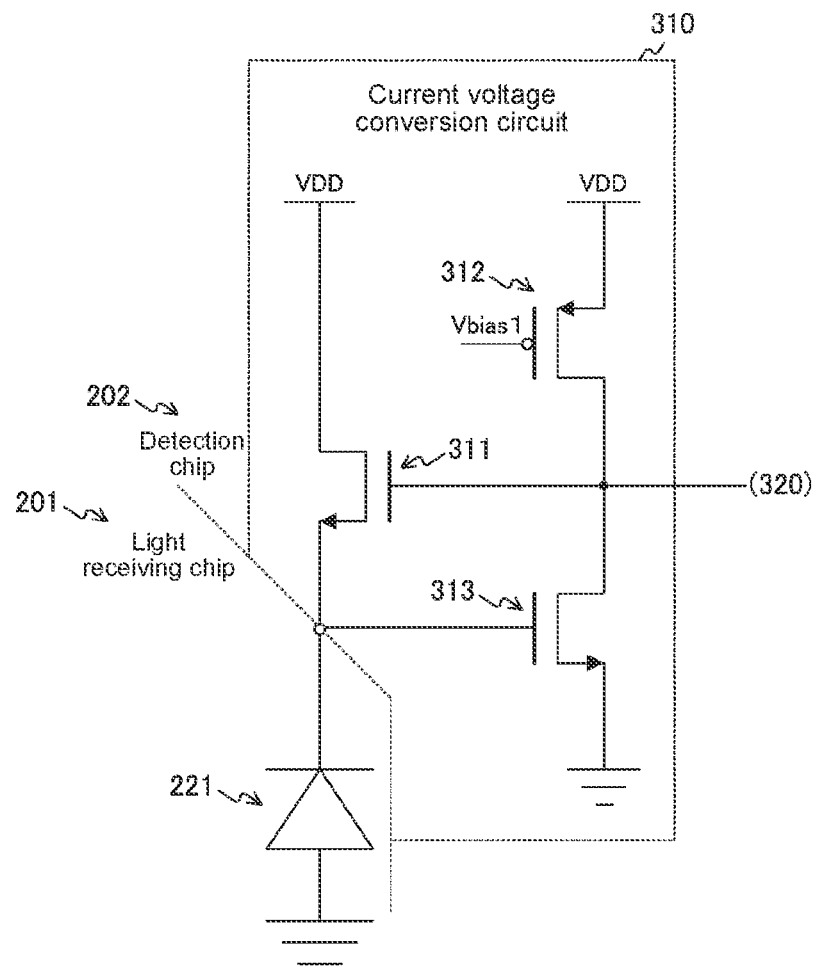

FIG. 7 is a circuit diagram depicting one configuration example of the current voltage conversion circuit 310 according to the first embodiment of the present technology. The current voltage conversion circuit 310 includes N-type transistors 311 and 313, and a P-type transistor 312. As each of the transistors, a MOS (Metal-Oxide-Semiconductor) transistor is used, for example.

A source of the N-type transistor 311 is connected to a cathode of the photodiode 221 and a drain is connected to a power source terminal. The P-type transistor 312 and the N-type transistor 313 are connected in series between the power source terminal and a ground terminal. In addition, a connection point of the P-type transistor 312 and the N-type transistor 313 is connected to a gate of the N-type transistor 311 and an input terminal of the buffer 320. In addition, a predetermined bias voltage Vbias1 is applied to a gate of the P-type transistor 312.

Drains of the N-type transistors 311 and 313 axe connected to a power source side and such a circuit is called as a source follower. By the two source followers connected in a loop shape, the photocurrent from the photodiode 221 is converted into the voltage signal. In addition, the P-type transistor 312 feeds a constant current to the N-type transistor 313.

In addition, a ground of the light receiving chip 201 and a ground of the detection chip 202 are separated each other as an interference countermeasure.

Configuration Example of Subtractor and Quantizer

Figure 8:
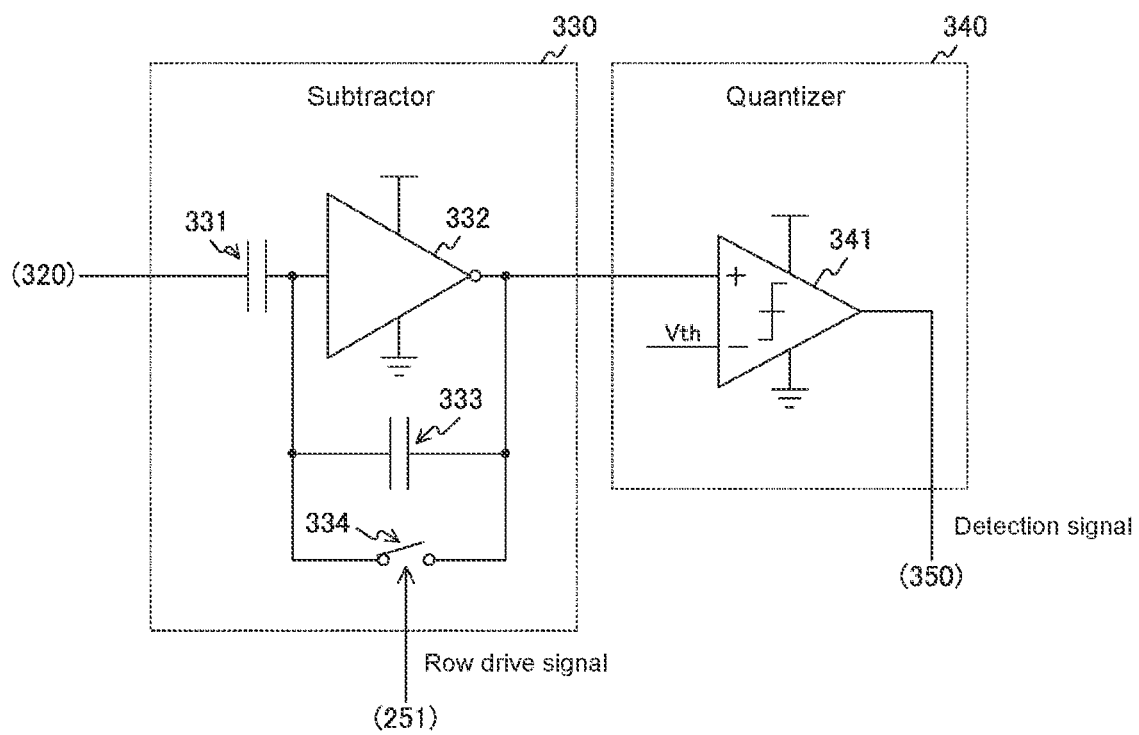
FIG. 8 A circuit diagram depicting one configuration example of a subtractor and a quantizer according to the first embodiment of the present technology.

FIG. 8 is a circuit diagram depicting one configuration example of the subtractor 330 and the quantizer 340 according to the first embodiment of the present technology. The subtractor 330 includes capacitors 331 and 333, an inverter 332, and a switch 334. In addition, the quantizer 340 includes a comparator 341.

One end of the capacitor 331 is connected to an output terminal of the buffer 320 and the other end is connected to the input terminal of the inverter 332. The capacitor 333 is connected to the inverter 332 in parallel. The switch 334 opens and closes a path connecting the both ends of the capacitor 333 in accordance with the row drive signal.

The inverter 332 inverts the voltage signal input via the capacitor 331. The inverter 332 outputs an inverted signal to a non-inverted input terminal (+) of the comparator 341.

When the switch 334 is turned on, a voltage signal $V_{init}$ is input to a buffer 320 side of the capacitor 331 and the opposite side becomes a virtual ground terminal. A potential of the virtual ground terminal is set to zero for convenience. At this time, when a capacity of the capacitor 331 is set to C1, a potential $Q_{init}$ accumulated on the capacitor 331 is represented by the following equation. On the other hand, the both ends of the capacitor 333 is short-circuited and an accumulated charge will be zero.

[Eq. 1]

$$Q_{init}=C1 \times V_{init} \qquad \text{Eq. 1}$$

Next, where it considers that the switch 334 is turned off and the voltage of the buffer 320 side of the capacitor 331 is changed to be $V_{after}$, a charge $Q_{after}$ accumulated on the capacitor 331 is represented by the following equation.

[Eq. 2]

$$Q_{after}=C1 \times V_{after} \qquad \text{Eq 2}$$

On the other hand, when an output voltage is set to $V_{out}$, a charge Q2 accumulated on the capacitor 333 is represented by the following equation.

[Eq. 3]

$$Q2=-C2 \times V_{out} \qquad \text{Eq. 3}$$

At this time, since a total charge amount of the capacitors 331 and 333 is not changed, the following equation holds.

[Eq. 4]

$$Q_{init}=Q_{after}+Q2 \qquad \text{Eq. 4}$$

When the equations 1 to 3 are substituted in the equation 4, which is transformed, the following equation is provided.

[Eq. 5]

$$V_{out}=-(C1/C2) \times V_{after}-V_{init}) \qquad \text{Eq. 5}$$

The equation 5 represents a subtraction operation of the voltage signal. A gain of a subtracted result will be C1/C2. Generally, it is desirable to maximize the gain and to design the C1 to be large and the C2 to be small. On the other hand, if the C2 is too small, kTC noise is increased and noise characteristics may be deteriorated. Therefore, a capacity C2 is reduced within the limit of allowable noise. In addition, the address event detection circuit 300 including the subtractor 330 is loaded for each pixel and the capacities C1 and C2 have thus a surface area limitation. By taking this into consideration, the C1 is set to have a value of 20 to 200 femtofarads (fF) and the C2 is set to have a value of 1 to 20 femtofarads (fF).

The comparator 311 compares the voltage signal from the subtractor 330 with the predetermined threshold voltage Vth applied to the inverted input terminal (−). The comparator 341 outputs a signal showing a compared result to the transfer circuit 350 as she detection signal.

In a synchronous type solid-state imaging device that images by synchronizing with a vertical synchronizing signal, a simple pixel circuit including a photodiode and three or four transistors is arranged for each pixel. In contrast, in an asynchronous type solid-state imaging device 200, as shown in FIG. 6 to FIG. 8, a pixel circuit including the photodiode 221 and she address event detection circuit 300, which is more complex than that of the synchronous type is arranged for each pixel. Accordingly, if the both of he photodiode 221 and the address event detection circuit 300 is arranged on she same chip, a mounting area will be wider than that of synchronous type. Therefore, in the solid-state imaging device 200, she photodiode 221 and she address event detection circuit 300 are dispersedly arranged on the light receiving chip 201 and the detection chip 202 laminated, to thereby reducing the mounting area.

In this way, according to the first embodiment of the present technology, since the photodiode 221 is arranged on The light receiving chip 201 and the address event detection circuit 300 is arranged on the detection chip 202, the mounting area can be reduced as compared with the case that these are mounted on the same chip.

MODIFICATION

In the above-described first embodiment, the entire current voltage conversion circuit 310 is arranged on the detection chip 202, which may increase a circuit scale of the circuit within the detection chip 202 along with an increase in the number of pixels. The solid-state imaging device 200 according to a modification of the first embodiment is different from that according to the first embodiment in that a part of the circuit of the current voltage conversion circuit 310 is arranged on the light receiving chip 201.

Figure 9:
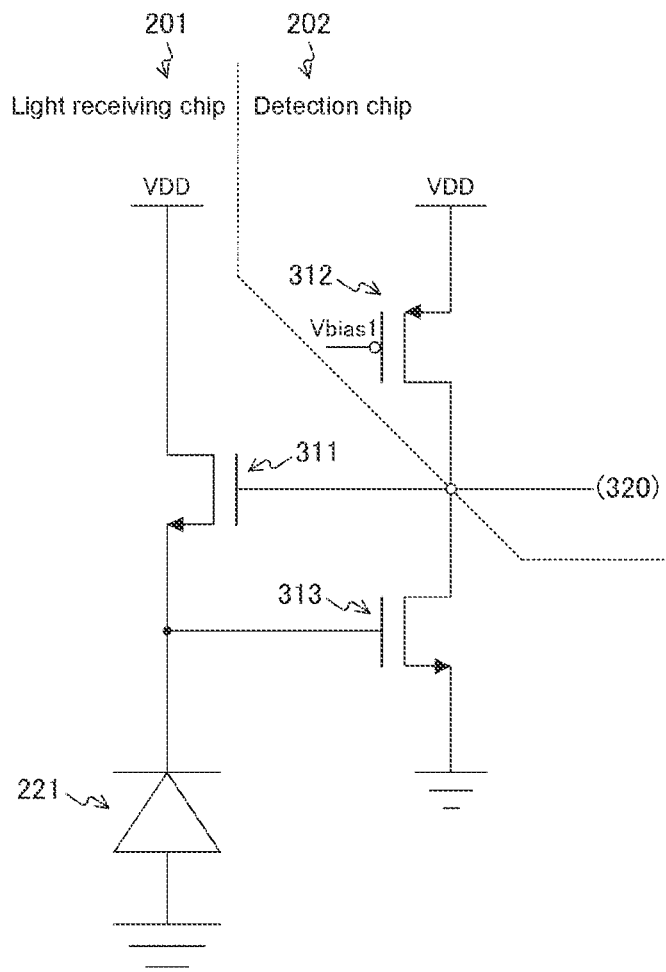
FIG. 9 A circuit diagram depicting an example of a circuit arranged on each of the light receiving chip and the detection chip according to a modification of the first embodiment of the present technology.

FIG. 9 is a circuit diagram depicting an example of a circuit arranged on each of the light receiving chip 201 and the detection chip 202 according to the modification of the first embodiment of the present technology. As illustrated in FIG. 9, the light receiving chip 201 further includes the N-type transistors 311 and 313 in addition to the photodiode 221. On the other hand, the detection chip includes a P-type transistor 312 and later stage circuits.

By arranging the N-type transistors 311 and 313 on the light receiving chip 201, the circuit scale of the detection chip 202 can be reduced for the transistors. In addition, as the light receiving chip 201 includes only the N-type transistors, the number of process steps of forming the transistors as compared with the case that both of the N-type transistor and the P-type transistor are used. Thus, manufacturing costs of the light receiving chip 201 can be reduced.

In this way, according to the modification of the first embodiment of the present technology, since the N-type transistors 311 and 313 are arranged on the light receiving chip 201 the manufacturing costs and the circuit scale of the detection chip 202 can be reduced.

2. SECOND EMBODIMENT

In the above-described first embodiment, the entire current voltage conversion circuit 310 is arranged on the detection chip 202, which may increase the circuit scale of the circuit within the detection chip 202 along with the increase in the number of pixels. The solid-state imaging device 200 according to a second embodiment is different from that according to the first embodiment in that the current voltage conversion circuit 310 and the buffer 320 within the address event detection circuit 300 may be arranged on the light receiving chip 201.

Figure 10:
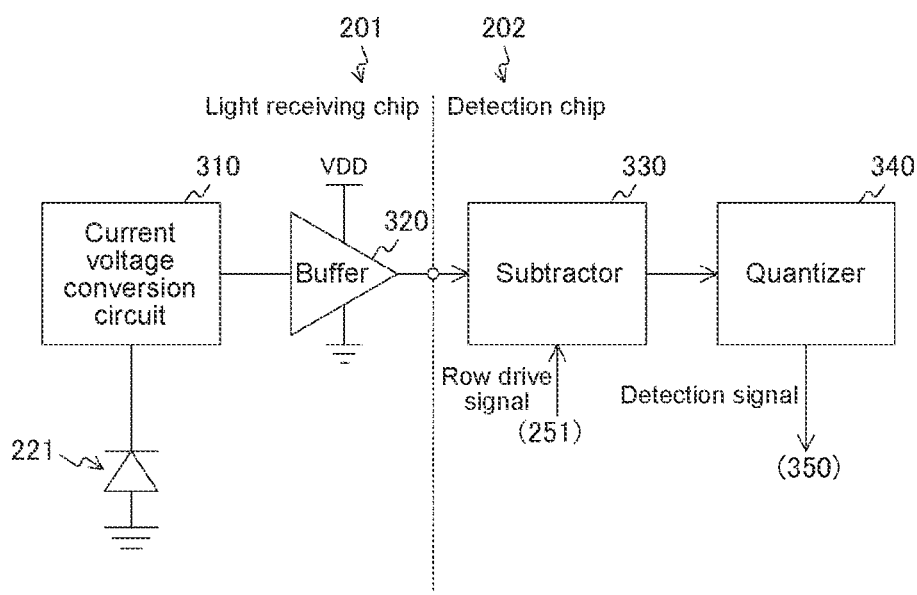
FIG. 10 A circuit diagram depicting an example of a circuit arranged on each of the light receiving chip and the detection chip according to a second embodiment of the present technology.

FIG. 10 is a circuit diagram depicting an example of a circuit arranged on each of the light receiving chip 201 and the detection chip 202 according to the second embodiment of the present technology. The light receiving chip 201 according to the second embodiment further includes the current voltage conversion circuit 310 and the buffer 320 in addition to the photodiode 221. On the other hand, the detection chip 202 includes circuits later than the subtractor 330.

In this way, according to the second embodiment of the present technology, since the current voltage conversion circuit 310 and the buffer 320 are arranged on the light receiving chip 201, the circuit scale of the detection chip 202 can be reduced as compared with the case that these are arranged on the detection chip.

First Modification

In the above-described second embodiment, the entire subtractor 330 is arranged on the detection chip 202, which may increase the circuit scale of the circuit within the detection chip 202 along with the increase in the number of pixels. The solid-state imaging device 200 according to a first modification of the second embodiment is different from that according to the second embodiment in that a part of the subtractor 330 is arranged on the light receiving chip 201.

Figure 11:
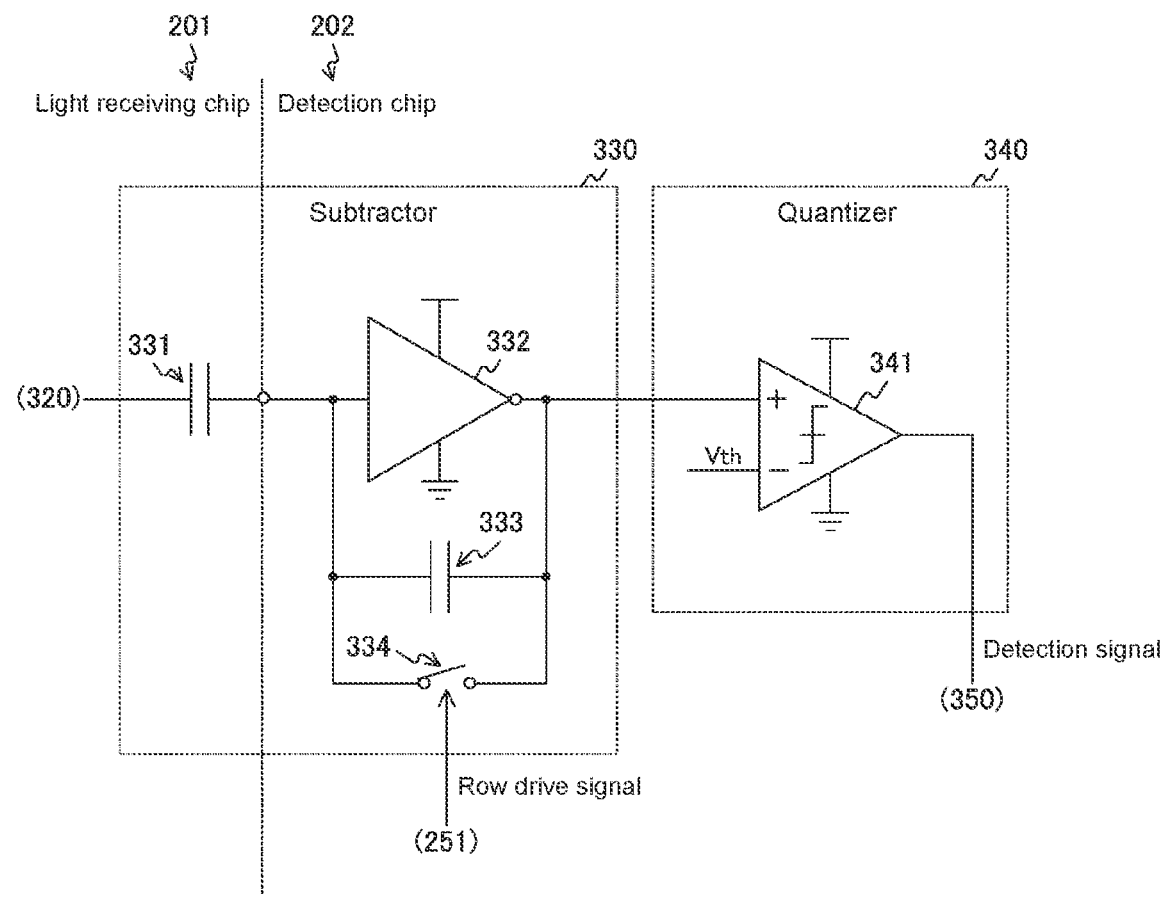
FIG. 11 A circuit diagram depicting an example of a circuit arranged on each of the light receiving chip and the detection chip according to a first modification of the second embodiment of the present technology.

FIG. 11 is a circuit diagram depicting an example of a circuit arranged on each of The light receiving chip 201 and the detection chip 202 according to the first modification of the second embodiment of the present technology.

The capacitor 331 within the subtractor 330 is arranged on the light receiving chip 201. Note that the capacitor 331 is an example of the claimed first capacitor.

On the other hand, the inverter 332, the capacitor 333, and the switch 334 within the subtractor 330 are arranged on the detection chip 202. Note that the inverter 332 is an example of the claimed inverter and the capacitor 333 is an example of the claimed second capacitor.

The capacitor such as the capacitors 331 and 333 generally needs a larger mounting area as compared with the transistor, the diode, or the like. The capacitor 331 and capacitor 333 are dispersedly arranged on the light receiving chip 201 and the detection chip 202 laminated, to thereby reducing the mounting area of the whole of the circuit.

In this way, according to the first modification of the second embodiment of the present technology, since the capacitor 331 is arranged on the light receiving chip 201 and the capacitor 333 is arranged on the detection chip 202, the mounting area can be reduced as compared with the case that these are mounted on the same chip.

Second Modification

In the above-described second embodiment, the subtractor 330 and the quantizer 340 are arranged on the detection chip 202, which may increase the circuit scale of the circuit within the detection chip 202 along with the increase in the number of pixels. The solid-state imaging device 200 according to the second modification of the second embodiment is different from that according to the second embodiment in that the subtractor 330 and the quantizer 340 are arranged on the light receiving chip 201.

Figure 12:
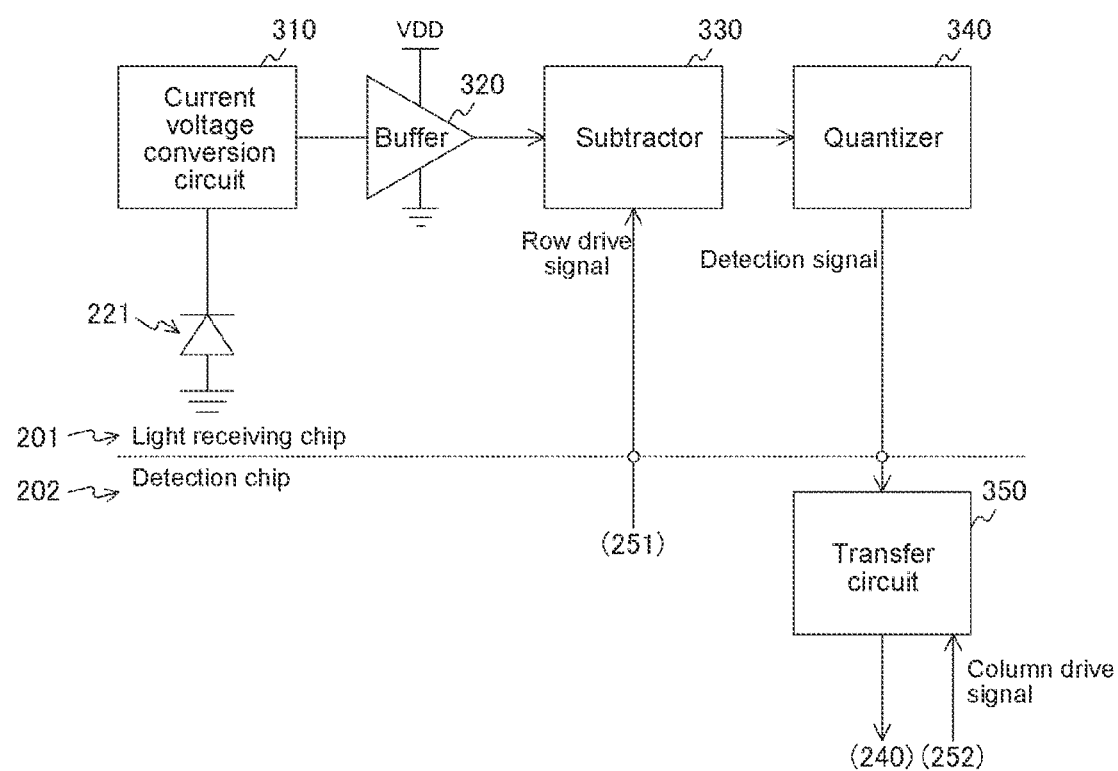
FIG. 12 A circuit diagram depicting an example of a circuit arranged on each of the light receiving chip and the detection chip according to a second modification of the second embodiment of the present technology.

FIG. 12 is a circuit diagram depicting an example of a circuit arranged on each of the light receiving chip 201 and the detection chip 202 according to a second modification of the second embodiment of the present technology. The second modification of the second embodiment of the present technology is different from that according to the second embodiment in that the light receiving chip 201 further includes the subtractor 330 and the quantizer 340 in addition to the photodiode 221, the current voltage conversion circuit 310, and the buffer 320. On the other hand, the detection chip 202 includes the transfer circuit 350 and the signal processing circuit 240.

In this way, according to the modification of the second embodiment of the present technology, since the subtractor 330 and the quantizer 340 are arranged on the light receiving chip 201, the circuit scale of the detection chip 202 can be reduced as compared with the case that these are mounted on the detection chip 202.

3. THIRD EMBODIMENT

In the above-described first embodiment, the current voltage conversion circuit 310 including the N-type transistors 311 and 313 and the P-type transistor 312 is arrayed within the address event detection section 260 for each pixel. However, it may increase the circuit scale of the address event detection section 260 along with the increase in the number of pixels. The solid-state imaging device 200 according to a third embodiment is different from that according to the first embodiment in that only the N-type transistor 311 is arranged on the current voltage conversion circuit 310.

Figure 13:
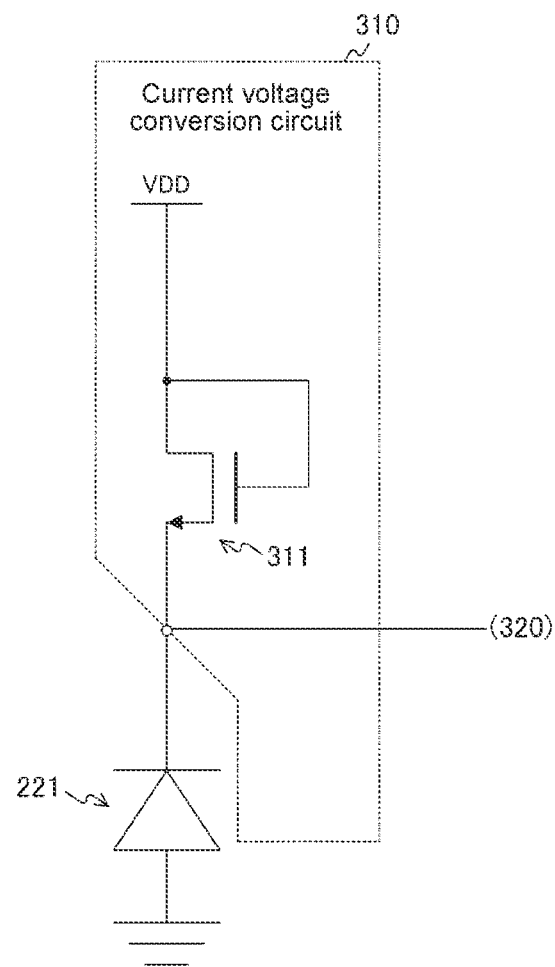
FIG. 13 A circuit diagram depicting one configuration example of the current voltage conversion circuit according to a third embodiment of the present technology.

FIG. 13 is a circuit diagram depicting one configuration example of the current voltage conversion circuit 310 according to the third embodiment of the present technology. The third embodiment is different from the first embodiment in that only the N-type transistor 311 is arranged on the current voltage conversion circuit 310. The gate and a drain of the N-type transistor 311 are commonly connected to the power source terminal and the source is connected to the cathode of the photodiode 221. In addition, a connection point of the N-type transistor 311 and the photodiode 221 is connected to the input terminal of the buffer 320.

Note chat also in the third embodiment, the circuits up to the buffer 320 can be arranged on the receiving chip 201 similar to the second embodiment. In addition, also in the third embodiment, the circuits up to the capacitor 331 can be arranged on the light receiving chip 201 similar to the first modification of the second embodiment. Furthermore, also in the third embodiment, the circuits up to the quantizer 340 can be arranged on the Light receiving chip 201 similar to the second modification of the second embodiment.

In this way, according co the third embodiment of the present technology, since only the N-type transistor 311 is arranged on the current voltage conversion circuit 310, the circuit scale of the current voltage conversion circuit 310 can be reduced as compared with the case that three transistors are arranged.

4. FOURTH EMBODIMENT

In the above-described first embodiment, the current voltage conversion circuit 310 including the N-type transistors 311 and 313 and the P-type transistor 312 is arrayed within the address event detection section 260 for each pixel. However, it may increase the circuit scale of the address event detection section 260 along with the increase in the number of pixels. The solid-state imaging device 200 according to a fourth embodiment is different from that according to the first embodiment in that only the diode is arranged on the current voltage conversion circuit 310.

Figure 14:
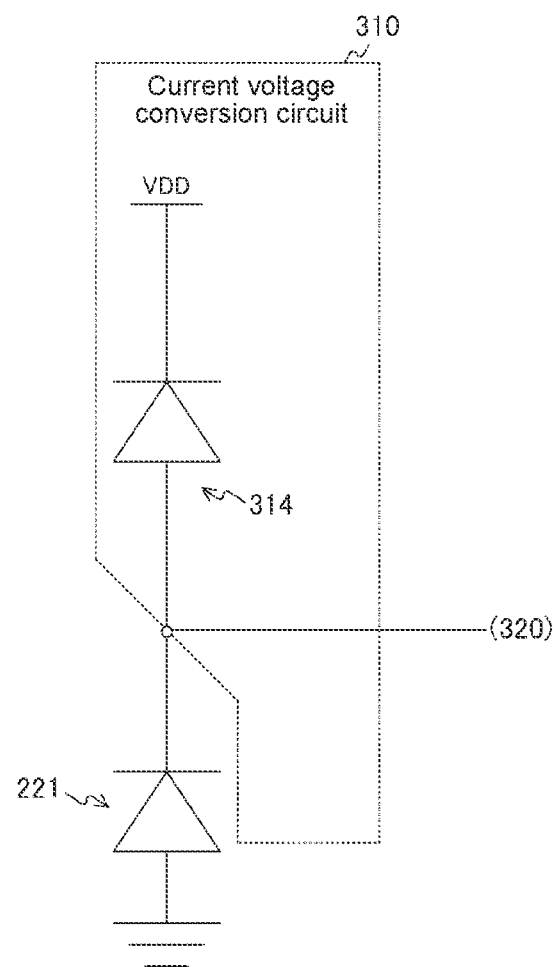
FIG. 14 A circuit diagram depicting one configuration example of the current voltage conversion circuit according to a fourth embodiment of the present technology.

FIG. 14 is a circuit diagram depicting one configuration example of the current voltage conversion circuit 310 according to the fourth embodiment of the present technology. Only the diode 314 is arranged on the current voltage conversion circuit 310 according to the fourth embodiment. A cathode of the diode 314 is connected to the power source terminal and an anode is connected to the cathode of the photodiode 211. In addition, a connection point of the diode 314 and the photodiode 221 is connected to the input terminal of the buffer 320.

Note that also in the fourth embodiment, the circuits up to the buffer 320 can be arranged on the receiving chip 201 similar to the second embodiment. In addition, also in the fourth embodiment, the circuits up to the capacitor 331 can be arranged on the light receiving chip 201 similar to the first modification of the second embodiment. Furthermore, also in the fourth embodiment, the circuits up to the quantizer 340 can be arranged on the light receiving chip 201 similar to the second modification of the second embodiment.

In this way, according to the fourth embodiment of the present technology, since only the diode 314 is arranged on the current voltage conversion circuit 310, the circuit scale of the current voltage conversion circuit 310 can be reduced as compared with the case that the three transistors are arranged.

5. FIFTH EMBODIMENT

In the above-described first embodiment, a source follower circuit is arranged on the current. voltage conversion circuit 310. In general, the source follower circuit has less good frequency characteristics. Accordingly, when low frequency noise is generated, the noise may not be sufficiently suppressed. The current voltage conversion circuit 310 according to a fifth embodiment is different from that according to the first embodiment in that a gate ground circuit is arranged to suppress the low frequency noise.

Figure 15:
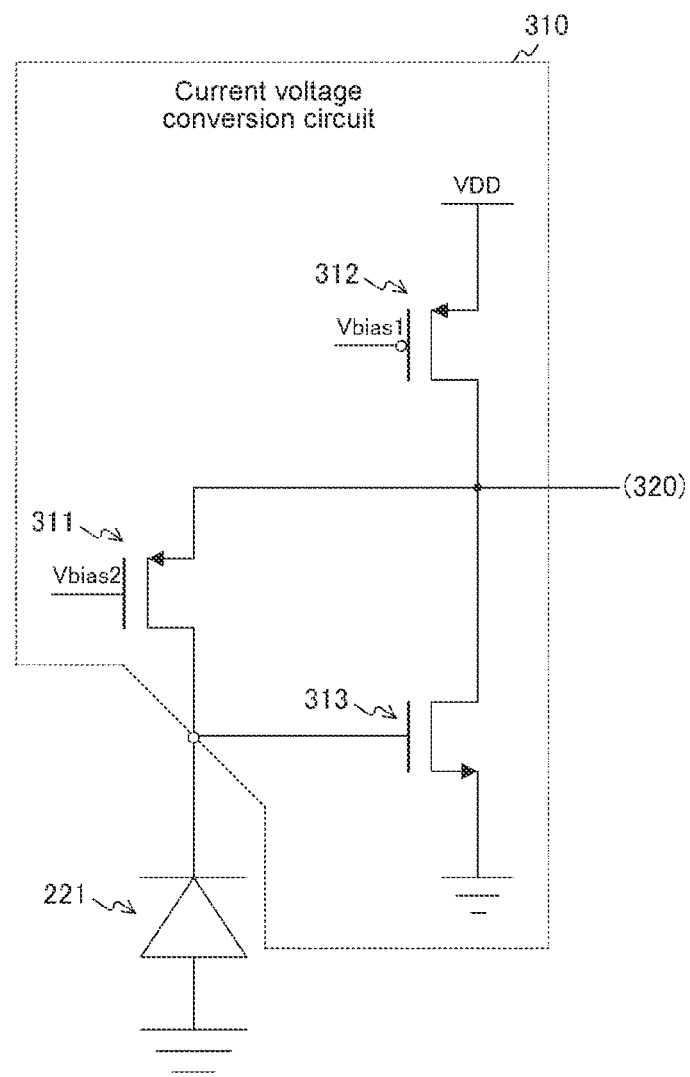
FIG. 15 A circuit diagram depicting one configuration example of the current voltage conversion circuit according to a fifth embodiment of the present technology.

FIG. 15 is a circuit diagram depicting one configuration example of the current voltage conversion circuit 310 according to the fifth embodiment of the present technology. A constant bias voltage Vbias2 is applied to the gate of the N-type transistor 311 according to the fifth embodiment, the drain is connected to the cathode of the photodiode 221, and the source is connected to the connection point of the P-type transistor 312 and the N-type transistor 313. Such a gate of the N-type transistor 311 is alternately grounded and such a circuit is called as a gate ground circuit. By arranging the gate ground circuit, a closed loop gain is increased and the low frequency noise can be suppressed.

Note that also in the fifth embodiment, the circuits up to the buffer 320 can be arranged on the receiving chip 201 similar to the second embodiment. In addition, also in the fifth embodiment, the circuits up to the capacitor 331 can be arranged on the light receiving chip 201 similar to the first modification of the second embodiment. Furthermore, also in the fifth embodiment, the circuits up to the quantizer 340 can be arranged on the light receiving chip 201 similar to the second modification of the second embodiment.

In this way, according to the fifth embodiment of the present technology, since the gate ground circuit is arranged within the current voltage conversion circuit 310, the low frequency noise can be suppressed as compared with the case that the source follower circuit is arranged.

6. SIXTH EMBODIMENT

In the above-described first embodiment, one loop circuit is arranged on the current voltage conversion circuit 310. Only with the one loop circuit, a. conversion gain may be insufficient when a current is converted into a voltage. A sixth embodiment is different from the first embodiment in that dual stage loop circuits are arranged on the current voltage conversion circuit 310.

Figure 16:
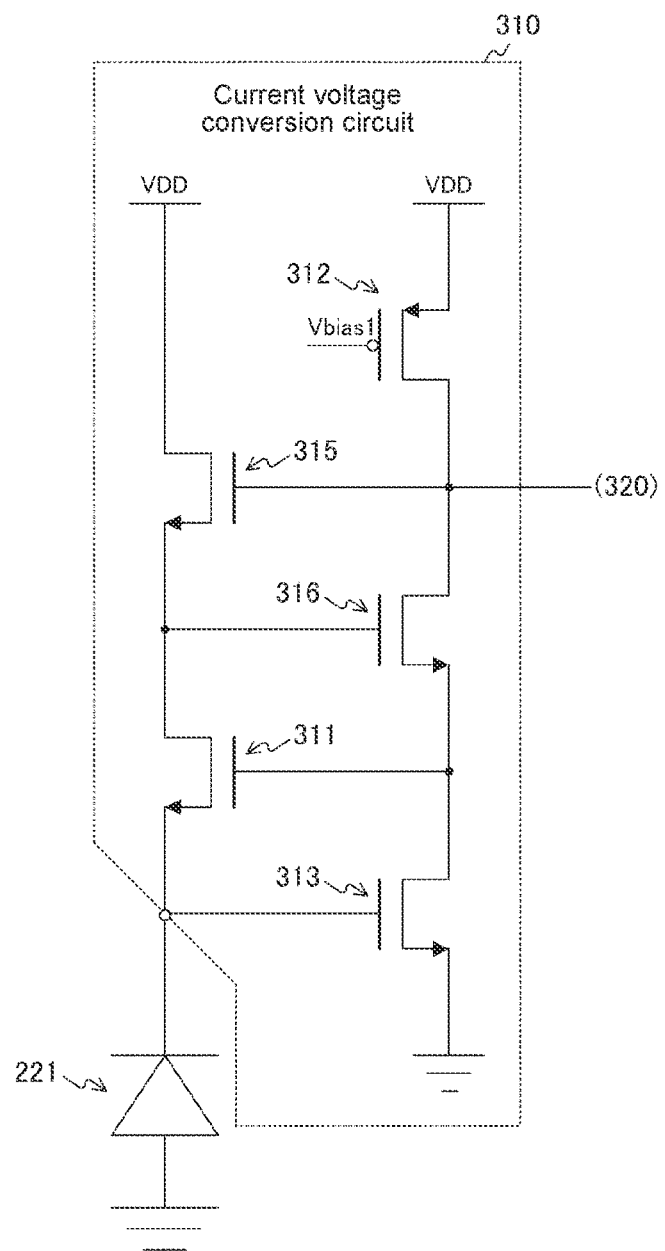
FIG. 16 A circuit diagram depicting one configuration example of the current voltage conversion circuit according to a sixth embodiment of the present technology.

FIG. 16 is a circuit diagram depicting one configuration example of the current voltage conversion circuit 310 according to the sixth embodiment of the present technology. The sixth embodiment is different from the first embodiment in that the current voltage conversion circuit 310 further includes N-type transistors 315 and 316. As each of the transistors, the MOS transistor is used, for example.

The N-type transistors 315 and 311 are connected in series between the power source terminal and the photodiode 221 and the P-type transistor 312 and the T-type transistors 316 and 313 are connected in series between the power source terminal and the ground terminal. In addition, the gate of the N-type transistor 311 is connected to a connection point of the N-type transistors 316 and 313 and a gate of the N-type transistor 315 is connected to a connection point of the P-type transistor 312 and the N-type transistor 316.

On the other hand, the gate of the N-type transistor 313 is connected to the connection point of the photodiode 221 and the N-type transistor 311 similar to the first embodiment. A gate of the N-type transistor 316 is connected to the connection point of the N-type transistors 311 and 315. In addition, the connection point of the P-type transistor 312 and the N-type transistor 316 is connected to the buffer 320.

Note that the N-type transistors 315 and 311 are examples of the claimed first N-type transistor and the N-type transistors 316 and 313 are examples of the second N-type transistor.

As described above, since the loop circuit including the N-type transistors 311 and 313 and the loop circuit including the N-type transistor 315 and 316 are connected in a two-stage configuration, the conversion gain becomes twice as compared with only a single loop circuit.

In this way, according to the sixth embodiment of the present technology, since the dual stage loop circuits are arranged on the current voltage conversion circuit 310, the conversion gain can be allowed to increase as compared with only the single loop circuit.

7. SEVENTH EMBODIMENT

In the above-described first embodiment, the circuits within the solid-state imaging device 200 are dispersedly arranged on she two chips. The mounting areas of the circuits within the solid-state imaging device 200 may be increased along with the increase in the number of pixels. The solid-state imaging device 200 according to a seventh embodiment is different from that: according to the first embodiment in that the circuits are dispersedly arranged on three chips.

Figure 17:
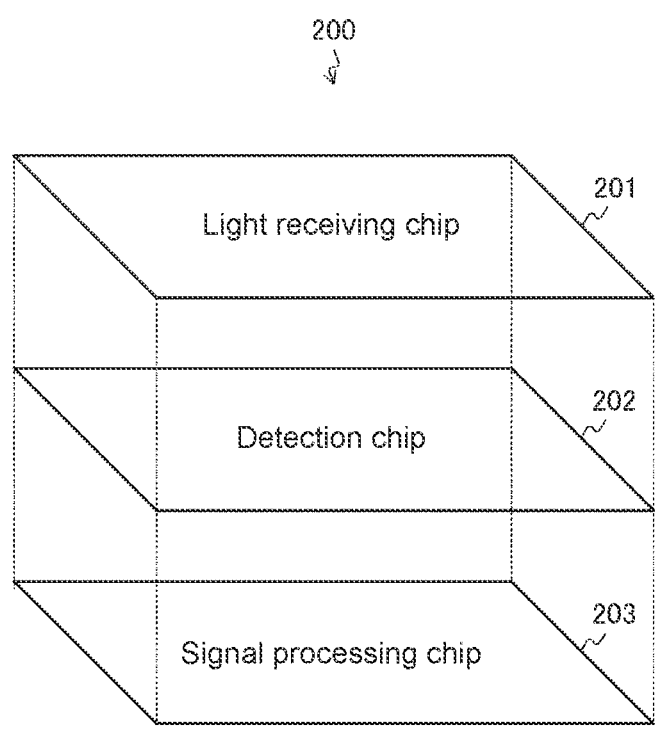
FIG. 17 A view depicting an example of a lamination structure of the solid-state imaging device according to a seventh embodiment of the present technology FIG. 18 An example of a plan view of the detection chip according to the seventh embodiment of the present technology.

FIG. 17 a view depicting an example of a lamination structure of the solid-state imaging device 200 according to the seventh embodiment of the present technology. The seventh embodiment is different from the first embodiment in that the solid-state imaging device 200 further includes a signal processing chip 203 in addition to the light receiving chip 201 and the detection chip 202. These chips are laminated.

Figure 18:
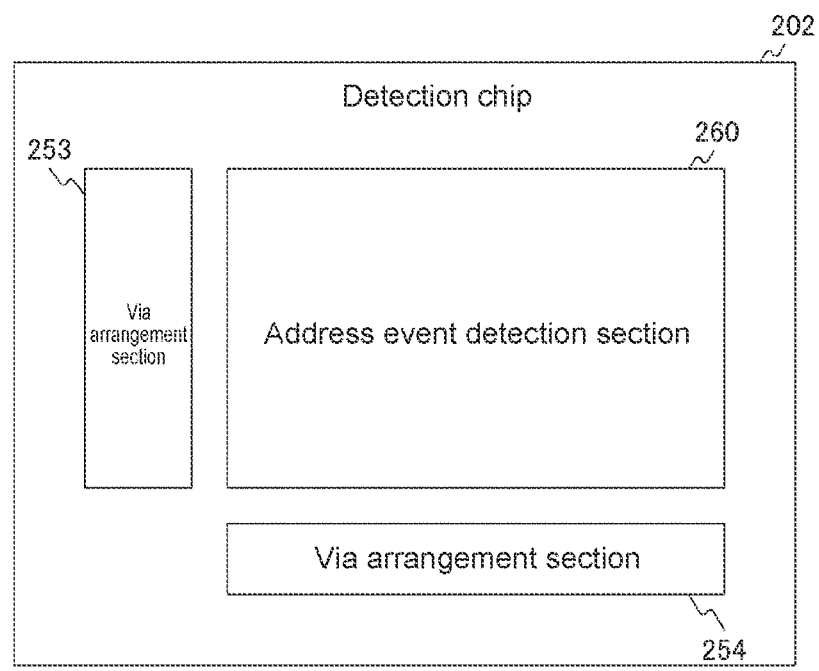

FIG. 18 is an example of a plan view of the detection chip 202 according to the seventh embodiment of the present technology. The seventh embodiment is different from the first embodiment in that the detection chip 202 does not include the row drive circuit 251, the column drive circuit 252, and the signal processing circuit 240. In addition, via arrangement sections 253 and 254 are arranged in place of the via arrangement sections 231, 232, and 233. Note that the seventh embodiment is similar to the first embodiment except that the via arrangement sections 211, 212, and 213 are not arranged on the light receiving chip 201.

Figure 19:
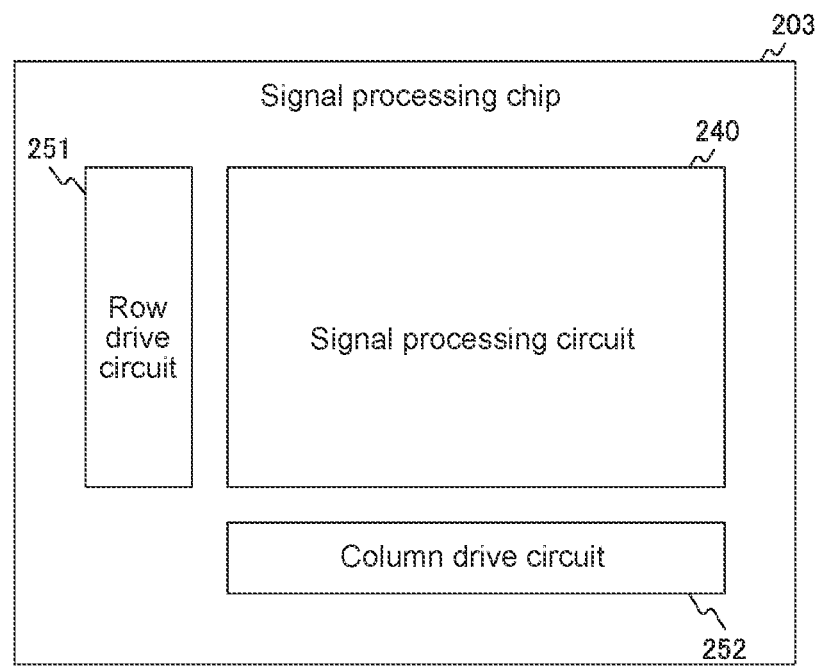
FIG. 19 An example of a plan view of the signal processing chip according to the seventh embodiment of the present technology.

FIG. 19 is an example of a plan view of the signal processing chip 203 according to the seventh embodiment of the present technology. The row drive circuit 251, the column drive circuit 252, and the signal processing circuit 240 are arranged on the signal processing chip 203.

In this way, since the circuits within the solid-state imaging device 200 are dispersedly arranged into three of the light receiving chip 201, the detection chip 202, and the signal processing chip 203 and arranged according to the seventh embodiment of the present technology, the mounting area can be further reduced as compared with the case that they are dispersedly arranged into the two.

8. EIGHTH EMBODIMENT

In the above-described first embodiment, the address event detection circuit 300 is arranged on the detection chip 202 for each pixel, which may increase the circuit scale of the detection chip 202 along with the increase in the number of pixels. The solid-state imaging device 200 according to an eighth embodiment is different from that according to the first embodiment in that a plurality of pixels shares one address event detection circuit 300.

Figure 20:
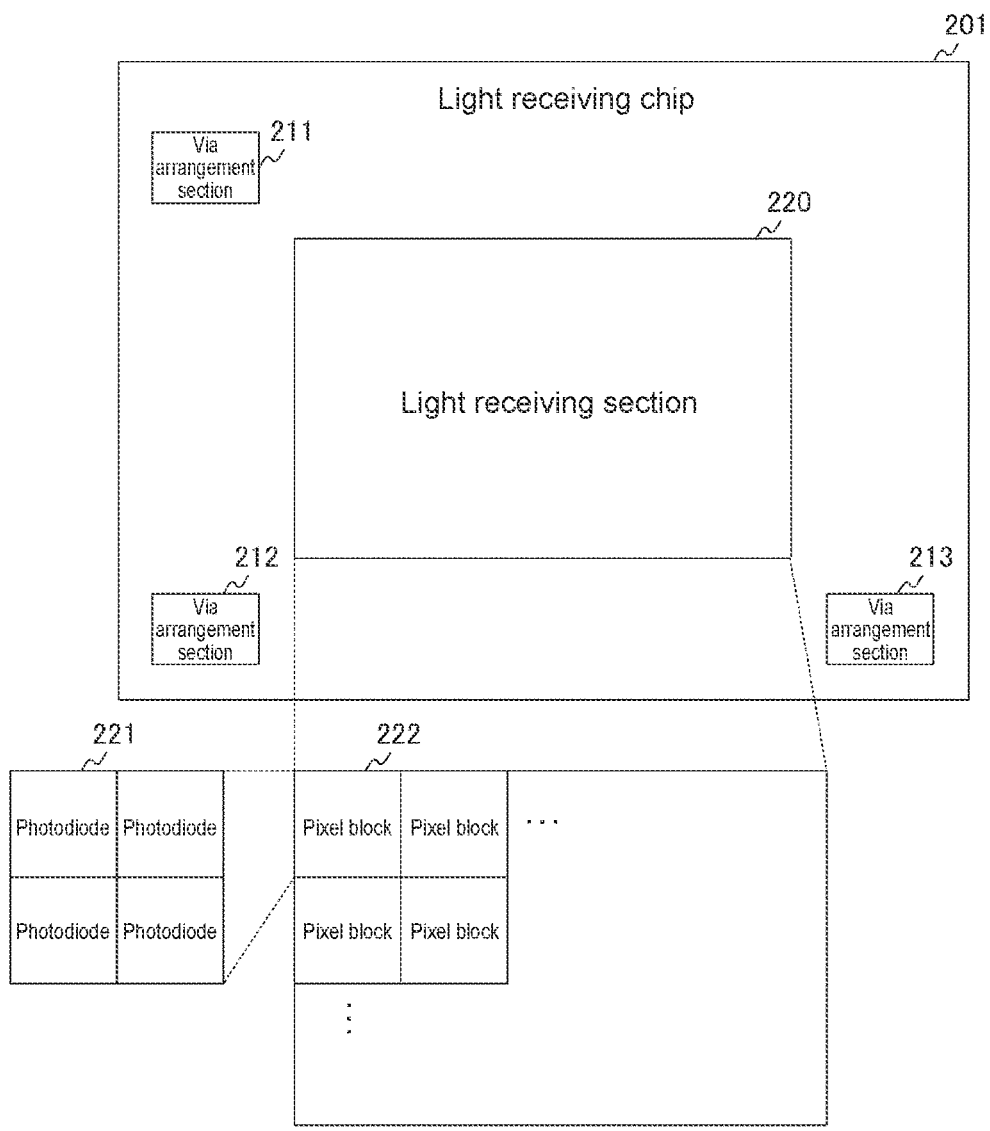
FIG. 20 An example of a plan view of the light receiving chip according to an eighth embodiment of the present technology.

FIG. 20 is an example of a plan view of the light receiving chip 201 according to the eighth embodiment of the present technology. The light receiving chip 201 according to the eighth embodiment is different from that according to the first embodiment in that a plurality of pixel blocks 222 is arrayed in a two-dimensional lattice on the light receiving section 220. A plurality of (for example, four) photodiodes 221 is arranged on each pixel block 222. Each pixel address is assigned to each photodiode 221, which are handed as the pixels.

Figure 21:
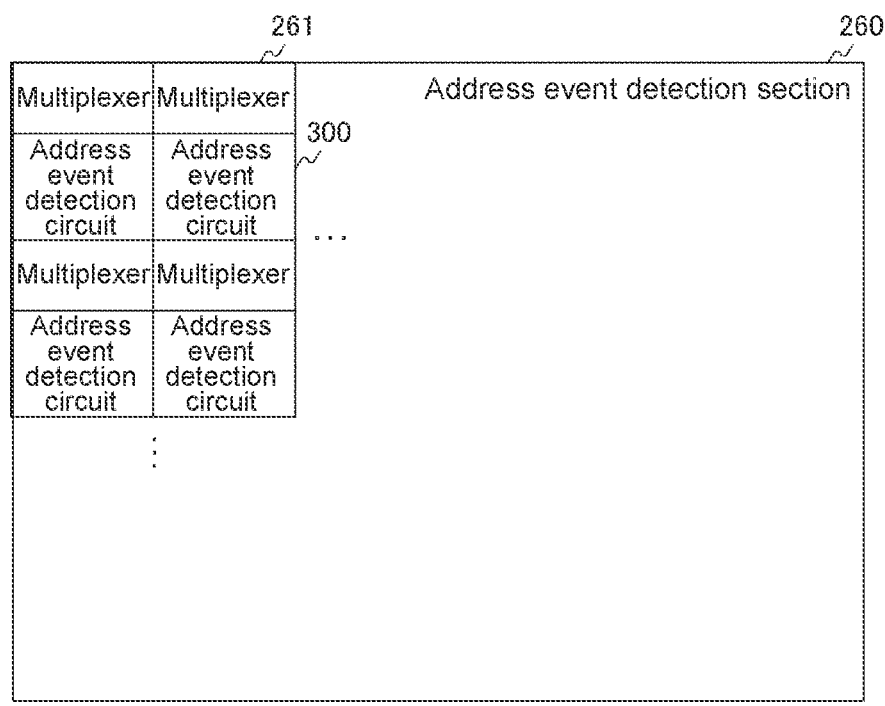
FIG. 21 An example of a plan view of the address event detection section according to the eighth embodiment of the present technology.

FIG. 21 is an example of a plan view of the address event detection section 260 according to the eighth embodiment of the present technology. A multiplexer 261 and the address event detection circuit 300 are arranged for each pixel block 222 in the address event detection section 260 in the eighth embodiment.

The multiplexer 261 selects any of the photocurrents from the corresponding plurality of photodiodes 221 and feeds the photocurrent to the address event detection circuit 300. The multiplexer 261 is controlled, for example, by the row drive circuit 251. The address event detection circuit 300 is connected to the corresponding photodiode 221 via the multiplexer 261.

In this way, according to the eighth embodiment of the present technology, since a plurality of pixels in the pixel block 222 shares one address event detection circuit 300, the circuit scale per pixel can be reduced as compared with the case that the plurality of pixels does not share.

Modification

In the above-describe eighth embodiment, the multiplexer 261 and the address event detection circuit 300 are arranged for each pixel on the detection chip 202, which may increase the circuit scale of the detection chip 202 along with the Increase in the number of pixels. The solid-state imaging device 200 according to a modification of the eighth embodiment is different from that according to the first embodiment in that each multiplexer 261 is arranged on she light receiving chip 201.

Figure 22:
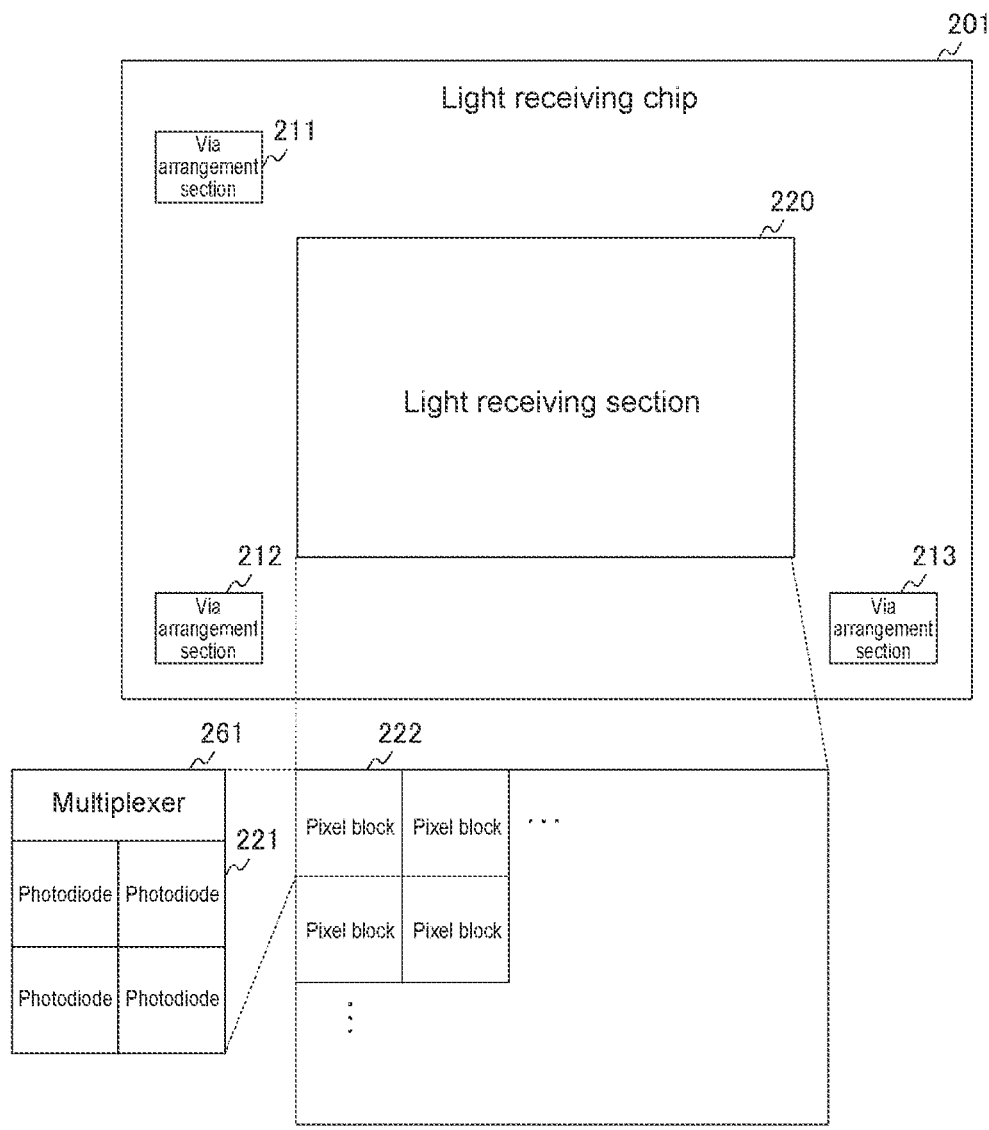
FIG. 22 An example of a plan view of the light receiving chip according to a modification of the eighth embodiment of the present technology FIG. 23 A circuit diagram depicting an example of an arrangement position of shields according to a ninth embodiment of the present technology.

FIG. 22 is an example of a plan view of the light receiving chip 201 according to a modification of the eighth embodiment of the present technology. The light receiving chip 201 according to the modification of the eighth embodiment is different from that according to the eighth embodiment in that the multiplexer 261 is further arranged on she pixel block 222.

In this way, according to the modification of the eighth embodiment of the present technology, since each multiplexer 261 is arranged on the light receiving chip 201, the circuit scale per pixel can be reduced as compared with the case that each multiplexer 261 is arranged on the detection chip 202.

9. NINTH EMBODIMENT

In the above-described first embodiment, the circuits are arranged on the light receiving chip 201 and the detection chip 202, respectively. By the operation of the circuits, electromagnetic noise may be generated. The solid-state imaging device 200 according to a ninth embodiment is different from that according to the above-described first embodiment in that shields are arranged between the light receiving chip 201 and the detection chip 202.

Figure 23:
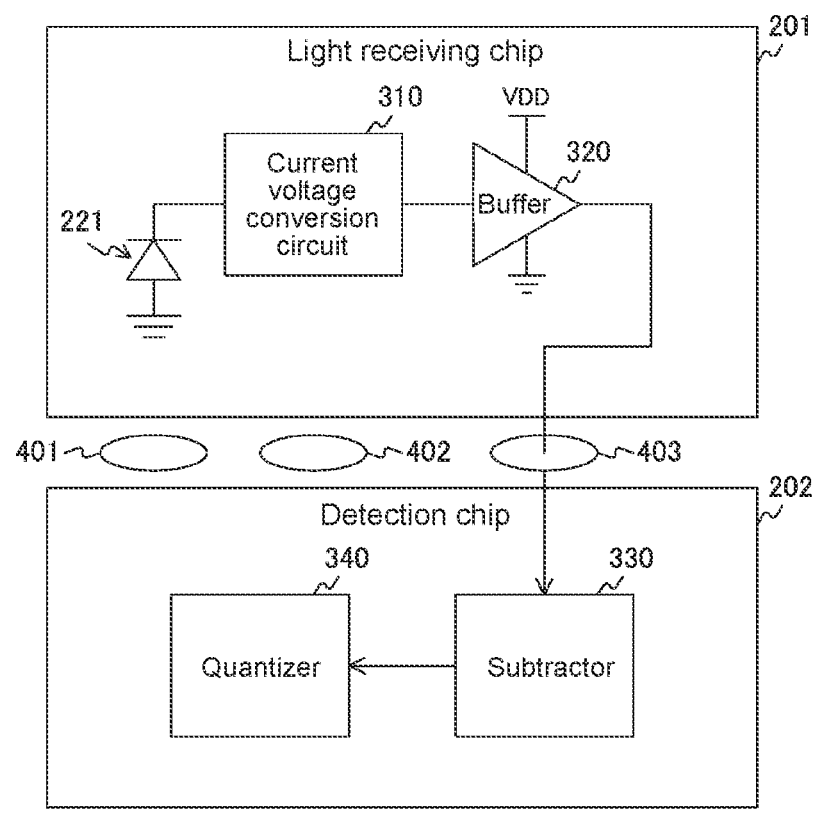

FIG. 23 is a circuit diagram depicting an example of an arrangement position of the shields according to the ninth embodiment of the present technology. The light receiving chip 201 according to the ninth embodiment is different from that according to the first embodiment in that the current voltage conversion circuit 310 and the buffer 320 are further arranged in addition to the photodiode 221. On the other hand, the subtractor 330 and the quantizer 340 are arranged on the detection chip 202.

In addition, shields 401, 402, and 403 are arranged between the light receiving chip 201 and the detection chip 202. The shields 401 and 402 are arranged directly under the photodiode 221 with a light receiving chip 201 side being upward. The shield 402 is arranged directly under the current voltage conversion circuit 310. In addition, the buffer 320 and the subtractor 330 are connected by the Cu—Cu bonding. And, the shield 403 is arranged directly under the buffer 320 and a signal line that connects the buffer 320 and the subtractor 330 is wired through the shield 403. As each of the shields 401, 402, and 403, an electromagnetic shield is used, for example.

Note that, in the ninth embodiment, the photodiode 221, the current voltage conversion circuit 310, and the buffer 320 are arranged on the light receiving chip 201, but it is not limited to this configuration. Similar to the first embodiment, only the photodiode 221 may be arranged on the light receiving chip 201. In addition, the arrangement may be similar to those of the first modification and the second modification of the second embodiment.

In this way, since the shields 401 to 403 are arranged between the light receiving chip 201 and the detection chip 202 according to the ninth embodiment of the present technology, the electromagnetic noise may be prevented from generating.

10. TENTH EMBODIMENT

In the above-described first embodiment, the solid-state imaging device 200 images image data including the detection signal. It is not possible to measure a distance from the image data to an object. Example methods of measuring the distance include a method of using a stereo image and a ToF (Time of Flight) method. These methods need to add a camera apart from the imaging lens 110 and the solid-state imaging device 200. Thus, in the configuration that the distance is measured by these methods, the number of components and the costs may be increased. The solid-state imaging device 200 according to a tenth embodiment is different from chat according to the first embodiment in that the distance is measured with each phase difference pixel by using an image plane phase difference method.

Figure 24:
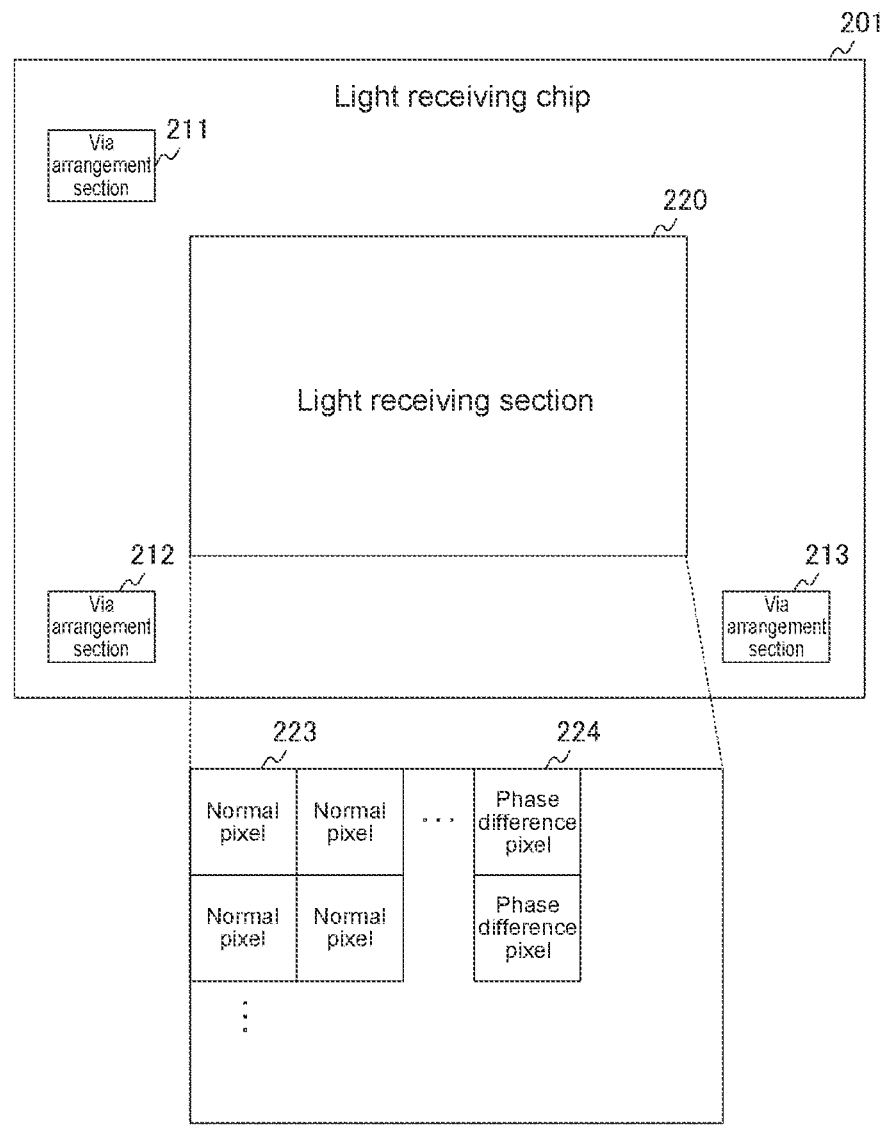
FIG. 24 An example of a plan view of the light receiving chip according to a tenth embodiment of the present technology.

FIG. 24 is an example of a plan view of the light receiving chip 201 according to the tenth embodiment of the present technology. The light receiving chip 201 according to the tenth embodiment is different from that according to the first embodiment in that a plurality of normal pixels 223 and a plurality pairs of phase difference pixels 224 are arranged within the light receiving section 220. The normal pixel 223 is a pixel for generating the image data. On the other hand, the phase difference pixel 224 is a pixel for determining a phase difference between two images.

Figure 25:
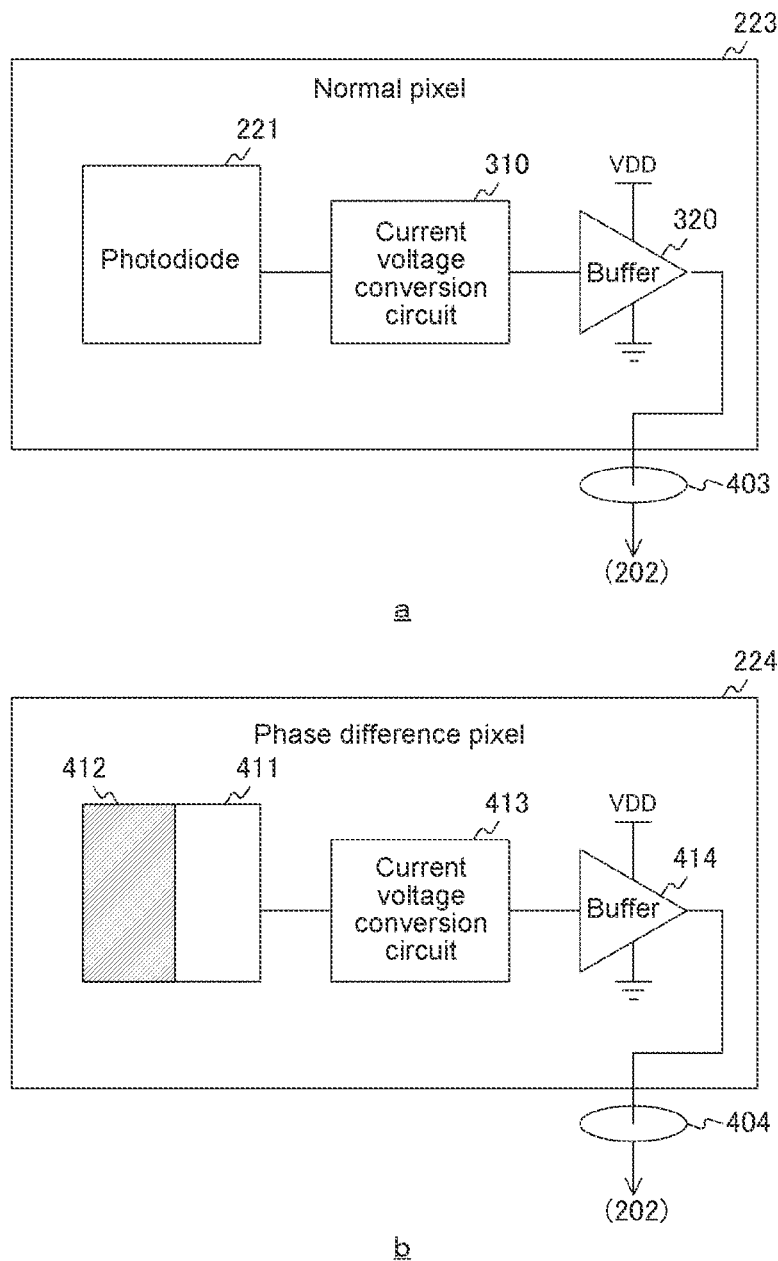
FIG. 25 A circuit diagram depicting one configuration example of a normal pixel and a phase difference pixel according to The tenth embodiment of the present technology FIG. 26 An example of a view of the light receiving chip according to an eleventh embodiment of the present technology.

FIG. 25 is a circuit diagram. depicting one configuration example of the normal pixel 223 and the phase difference pixel 224 according to the tenth embodiment of the present technology. FIG. 25(a) is a circuit diagram depicting one configuration example of the normal pixel 223 and FIG. 25(b) is a circuit diagram depicting one configuration example of the phase difference pixel 224.

The photodiode 221, the current voltage conversion circuit 310, and the buffer 320 are arranged on the normal pixel 223. In addition, the shield 403 is arranged directly under the buffer 320. Note that the shields 401 and 402 may further arranged similar to the ninth embodiment.

On the other hand, the photodiode 411, the current voltage conversion circuit 413, and the buffer 414 are arranged on the phase difference pixel 224. The photodiode 411, the current voltage conversion circuit 413, and the buffer 414 are configured similar to the photodiode 221, the current voltage conversion circuit 310, and the buffer 320. Note that a part of the photodiode 411 is light-shielded with a light shield section 412. In addition, the light-shielded part of one of the pair of the phase difference pixels 224 is different from that of the other.

The signal processing circuit 240 determines a phase difference from a detection signal from the plurality pairs of phase difference pixels 224 and measures the difference from the phase difference. The measured distance is used for an AF (Auto Focus) and the like.

In this way, in the tenth embodiment of the present technology, since the plurality pairs of phase difference pixels 224 are arranged, the solid-state imaging device 200 can measure the distance toward the object on the basis of the detection signal of each pixel.

11. ELEVENTH EMBODIMENT

In the above described first embodiment, the current voltage conversion circuit 310 is arranged on the detection chip 202 for each pixel, which may increase the circuit scale and the mounting area of the detection chip 202 along with the increase in the number of pixels. The solid-state imaging device 200 according to an eleventh embodiment is different from that according to the first embodiment in that the plurality of pixels shares one current voltage conversion circuit 310.

Figure 26:
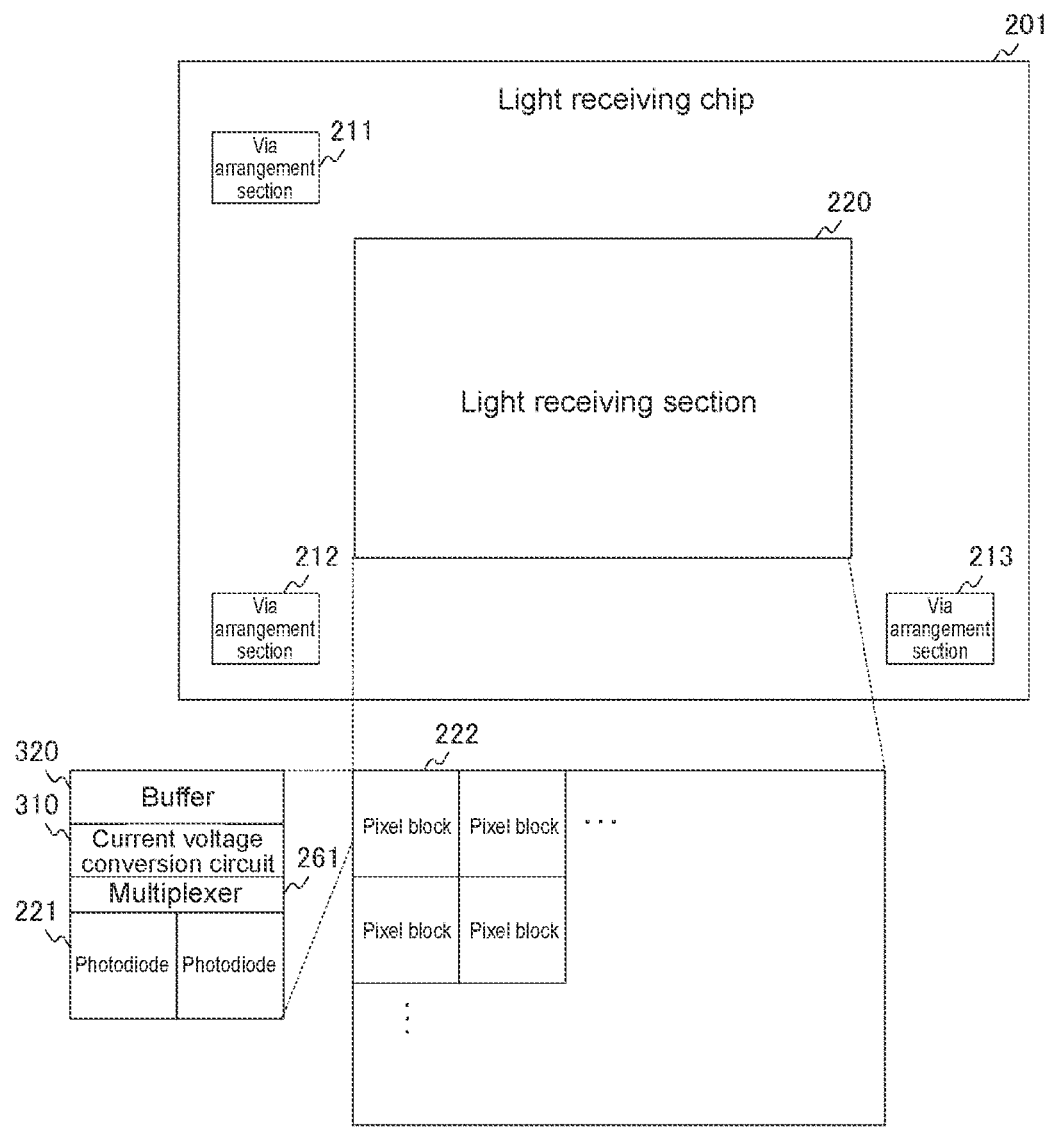

FIG. 26 is an example of a plan view of the light receiving chip 201 according to the eleventh embodiment of the present technology. The light receiving chip 201 according to the eleventh embodiment is different from that according to the first embodiment in that a plurality of pixel blocks 222 is arrayed in a two-dimensional lattice within the light receiving section 220.

A plurality of (such as two) photodiodes 221, a multiplexer 261, a current voltage conversion circuit 310, and a buffer 320 is arranged on each pixel block 222. The multiplexer 261 selects any of photocurrents from the respective plurality of photodiodes 221 and feeds the photocurrent to the current voltage conversion circuit 310.

Figure 27:
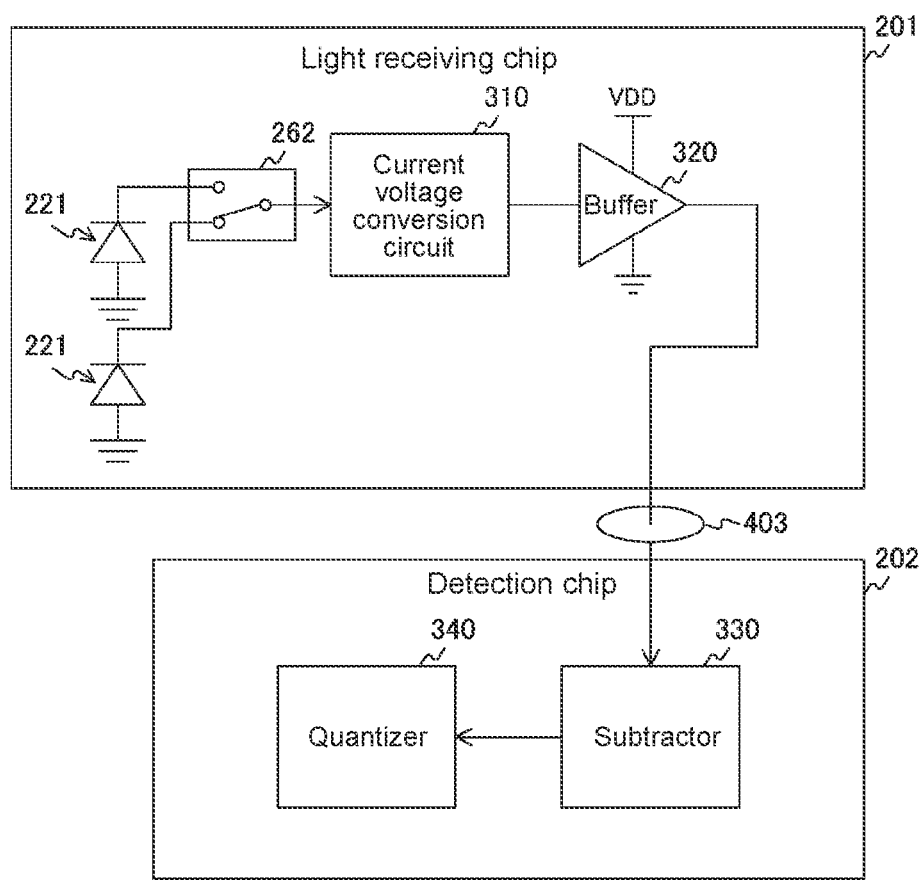
FIG. 27 A circuit diagram depicting an example of an arrangement position of a shield according to the eleventh embodiment of the present technology.

FIG. 27 is a circuit diagram depicting an example of an arrangement position of a shield according to the eleventh embodiment of the present technology. As shown in FIG. 27, the shield 403 is arranged directly under the buffer 320. Note that the shields 401 and 402 may be further arranged similar to the ninth embodiment.

In this way, according to the eleventh embodiment of the present technology, since the plurality of pixels in the pixel block 222 shares one current voltage conversion circuit 310, the circuit scale per pixel can be reduced as compared with the case that the plurality of pixels does not share.

12. TWELFTH EMBODIMENT

In the above-described first embodiment, the solid-state imaging device 200 compares the voltage signal with one threshold voltage and generates a 1-bit detection signal for each pixel. However, since only 1-bit information is generated for each pixel, it results in the image data having a poor image quality as compared with the case that a plurality of bits is generated for each pixel. The solid-state imaging device 200 according to a twelfth embodiment is different from that according to the first embodiment in that the detection signal of the plurality of bits is generated for each pixel by comparing the voltage signal with the plurality of threshold voltages.

Figure 28:
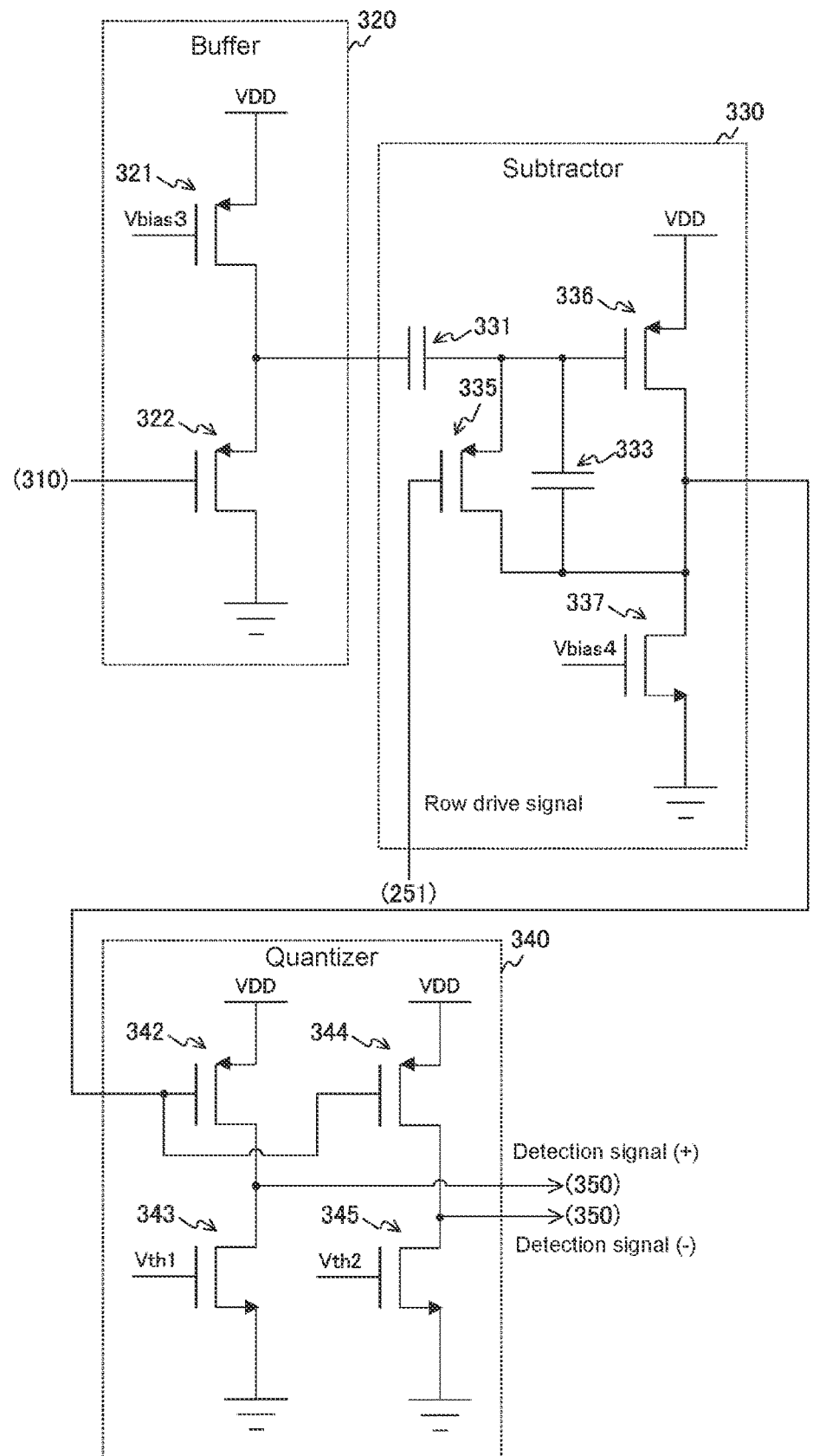
FIG. 28 A circuit diagram depicting one configuration example of a buffer, the subtractor, and the quantizer according to a twelfth embodiment of the present technology.

FIG. 28 is a circuit diagram depicting one configuration example of the buffer 320, the subtractor 330, and the quantizer 340 according to the twelfth embodiment of the present technology.

The buffer 320 includes N-type transistors 321 and 322. The subtractor 330 includes capacitors 331 and 333 and N-type transistors 335 to 337. The quantizer 340 includes N-type transistors 342 to 345. As each of the transistors in the circuit, the MOS transistor is used, for example.

The N-type transistors 321 and 322 are connected in series between the power source terminal and the ground terminal. In addition, a predetermined bias voltage Vbias3 is applied to a gate of the N-type transistor 321 and a gate of he N-type transistor 322 is connected to the current voltage conversion circuit 310. A connection point of the N-type transistors 321 and 322 is connected to one end of the capacitor 331.

In addition, N-type transistors 336 and 337 are connected in series between the power source terminal and the ground terminal. A predetermined bias voltage Vbias4 is applied to a gate of the N-type transistor 331. The other end of the capacitor 331 is connected to a gate of the N-type transistor 336. One end of the capacitor 333 is connected to the gate of the N-type transistor 336 and the other end is input to a connection point of the N-type transistor 336 and 337. A source and a drain of the N-type transistor 335 are connected to both ends of the capacitor 333 and the row drive signal from the row drive circuit 251 is input to the gate. The N-type transistor 335 functions as the switch 334 illustrated in FIG. 8.

In addition, N-type transistors 342 and 343 are connected in series between the power source terminal and the ground terminal. The N-type transistors 344 and 345 are also connected in series between the power source terminal and the ground terminal. In addition, gates of the N-type transistors 342 and 344 are connected to a connection point of the N-type transistors 336 and 337. A threshold voltage Vth1 is input to a gate of the N-type transistor 343 and a threshold voltage Vth2 lower than the Vth1 is input to a gate of the N-type transistor 345. A 1-bit detection signal at a positive side (+) is output from the connection point of the N-type transistor 342 and 343 and a 1-bit detection signal at a negative side (−) is output from the connection point of the N-type transistor 344 and 345.

With the above-described configuration, the quantizer 340 compares the voltage signal with the two threshold voltages and generates the detection signal of 2 bits. Accordingly, the solid-state imaging device 200 can generate the image data including 2-bit information for each pixel.

In this way, according to the twelfth embodiment of the present technology, since the solid-state imaging device 200 compares the voltage signal with the plurality of threshold voltages and generates the detection signal of the plurality of bits for each pixel, the image quality of the image data can be improved as compared with the case that the 1-bit detection signal is generated for each pixel.

13. APPLICATION EXAMPLE FOR MOBILE BODY

The technology of the present disclosure (the present technology) can be applied to a variety of products. For example, the technology of the present disclosure may be realized as a device included in any type of a mobile body such as an automobile, an electric automobile, a hybrid. electric automobile, a motorcycle, a bicycle, personal mobility, an airplane, a drone, a ship, a robot, and the like.

Figure 29:
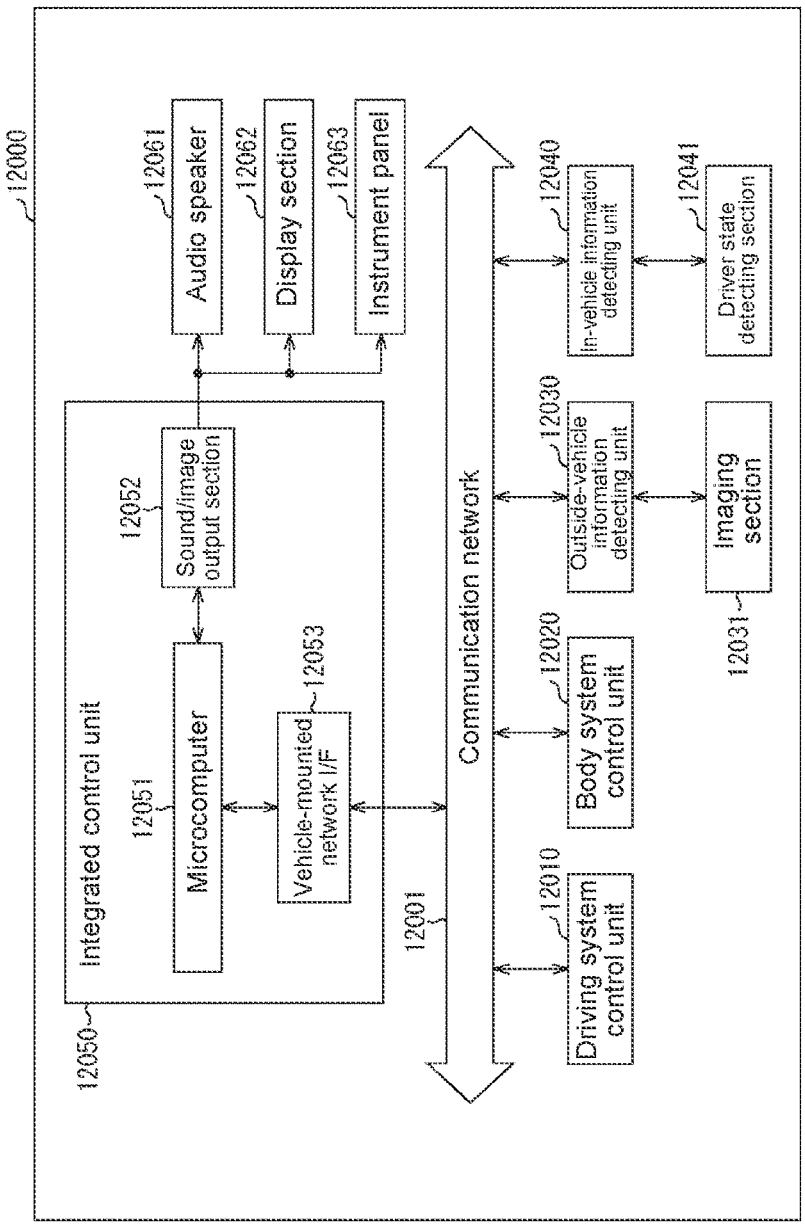
FIG. 29 A block diagram depicting an example of schematic configuration of a vehicle control system as an example of a mobile body control system.

FIG. 29 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 29, the vehicle control system 12000 includes a driving system control unit 12010, a body system control unit 12020, an outside vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control writ 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit. 12030 detects information about the outside of she vehicle including the vehicle control system 12000. For example, the outside-vehicle information detecting unit 12030 is connected with an imaging section 12031. The outside-vehicle information detecting unit 12030 makes the imaging. section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section. 12041 that detects the state of a driver. The driver state detecting section. 12041, for example, includes a camera. that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit. 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle, In the example of FIG. 29, an audio speaker 12061, a display section 12062, and an instrument panel 12063 are illustrated as the output device. The display section 12062 may, for example, include at least one of an on-board display and a head-up display.

Figure 30:
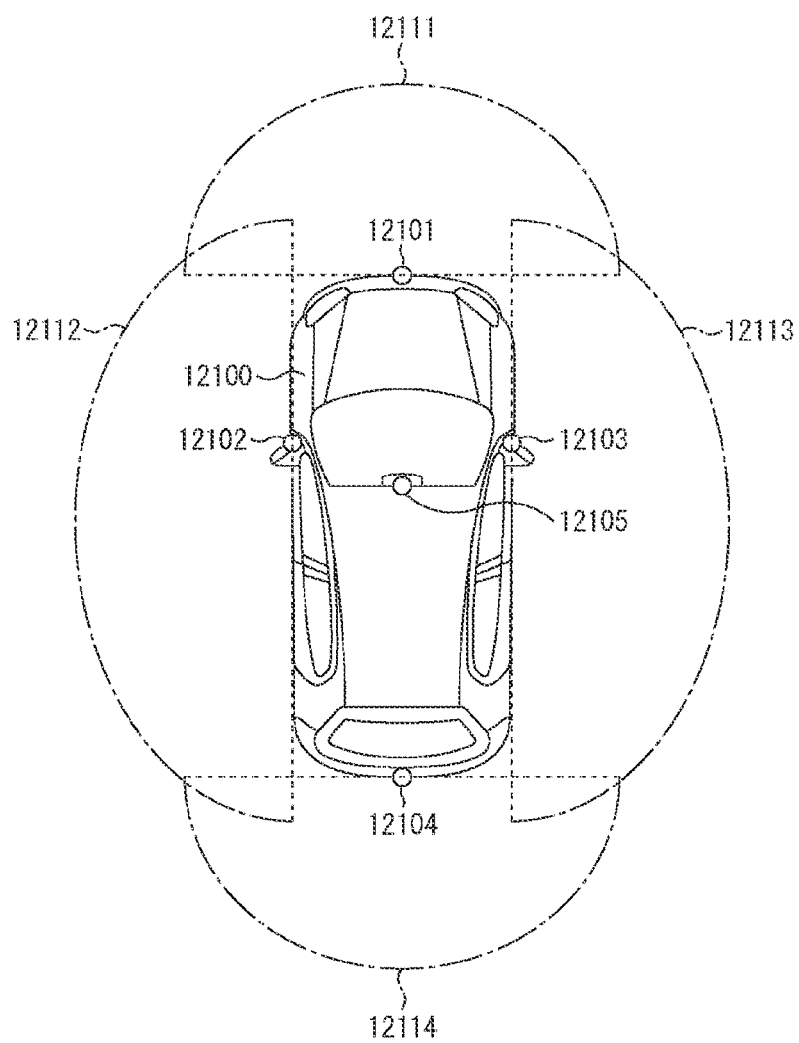
FIG. 30 A diagram depicting an example of an installation position of an imaging section.

FIG. 30 is a diagram depicting an example of the installation position of the imaging section 12031.

In FIG. 30, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 30 depicts an example of photographing ranges of the imaging sections 12101 to 12104. An imaging range 12111 represents the imaging range of the imaging section 12101 provided to the front nose. imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of one driver or the like.

For example, the microcomputer 12051 can classify three-dimensional object data on three-dimensional objects into three-dimensional object data of a two-wheeled vehicle, a standard--sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

As above, an example of the vehicle control system to which the technology according to the present disclosure is applicable has been described. The technology according to the present disclosure is applicable to the imaging section 12031 of the above-described configurations. Specifically, the imaging apparatus 100 of FIG. 1 is applicable to the imaging section 12031 of FIG. 29. By applying the technology according to the present disclosure to the imaging section 12031, the mounting area of the circuit can be reduced and the imaging section 12031 can be smaller.

Note that the above-described embodiments show examples of embodying the present technology and the matters in the embodiments have a correspondence relationship with the matters used to specify the invention in the claims. Similarly, the matters used to specify the invention in the claims have a correspondence relationship with the matters in the embodiments of the present technology to which the same title is added. It should be appreciated that the present technology is not limited to the embodiments and can be embodied by applying various alterations to the embodiment without departing from the gist of she present technology.

The present technology may also have the following structures.

(1) A solid-state imaging device, including:
 a row drive circuit;
 a column drive circuit; and
 a plurality of pixels,
 each of the plurality of pixels including
  a photodiode that photoelectrically converts incident light and generates a photo current,
  a pixel circuit that quantizes a voltage signal corresponding to the photocurrent and outputs a quantized voltage signal as a detection signal, and
  a connection section,
 the row drive circuit and the column drive circuit being arranged on a second chip,
 the photodiode being arranged on a first chip,
  at least a part of the pixel circuit being arranged on the second chip and being electrically connected to the photodiode arranged on the first chip via the connection section.

(2) The solid-state imaging device according to (1), in which
 in the pixel circuit,
 a plurality of N-type transistors that converts the photocurrent into the voltage signal and outputs the voltage signal is further arranged on the first chip, and
 a P-type transistor that feeds a constant current to any of the plurality of N-type transistors is further arranged on the second chip.

(3) The solid-state imaging device according to (1), in which
 in the pixel circuit, a current voltage conversion circuit that converts the phot: current into the voltage signal is further arranged on the second chip.

(4) The solid-state imaging device according to (3), in which
 the current voltage conversion circuit includes an N-type transistor having a drain connected to a cathode of the photodiode and a gate and a source commonly connected to a power source, and
 a connection point of the N-type transistor and the photodiode is connected to an input terminal of the buffer. (5) The solid-state imaging device according to (3) or (4), in which
 the current voltage conversion circuit includes a. diode having an anode connected to a cathode of the photodiode and a cathode connected to a power source, and
 a connection point of the diode and the photodiode is connected to an input terminal of the buffer.

(6) The solid-state imaging device according to any of (3) to (5), in which
 the current voltage conversion circuit includes a first N-type transistor having a gate to which a predetermined bias voltage is applied and a drain connected to a cathode of the photodiode, and
 a second N-type transistor having a gate connected to a connection point of the photodiode and the first transistor, a drain connected to a source of the first N-type transistor, and a source grounded, and
 a connection point of the first and second transistors is connected to an input terminal of the buffer.

(7) The solid-state imaging device according to any of (3) to (6), in which the current voltage conversion circuit includes multiple stage loop circuits, and each of the multiple stage loop circuits includes a first N-type transistor and a second N-type transistor having a gate connected to a source of the first N-type transistor and a drain connected to a gate of the first N-type transistor.

(8) The solid-state imaging device according to (1), in which in the pixel circuit, a current voltage conversion circuit that converts the photocurrent into the voltage signal and a buffer that corrects and outputs the voltage signal are further arranged on the first chip.

(9) The solid-state imaging device according to (8), in which in the pixel circuit, a first capacitor having one end connected to an output terminal of the buffer is further arranged on the first chip, and an inverter having an input terminal connected to another terminal of the first capacitor and a second capacitor connected to the inverter in parallel are further arranged on the second chip.

(10) The solid-state imaging device according to (8), in which in the pixel circuit, a subtractor that lowers a level of the voltage signal output from the buffer and a quantizer that quantizes the lowered voltage signal and outputs a quantized lowered voltage signal as the detection signal are further arranged on the first chip.

(1) A solid-state imaging device, including:

a light receiving chip on which a photodiode that photoelectrically converts incident light and generates a photocurrent is arranged; and a detection chip that quantizes a voltage signal corresponding to the photocurrent and outputs a quantized voltage signal as a detection signal.

(2) The solid-state imaging device according to (1), in which a plurality of N-type transistors that converts and outputs the photocurrent into the voltage signal is further arranged on the light receiving chip, and a P-type transistor that feeds a constant current to any of the plurality of N-type transistors is further arranged on the detection chip.

(3) The solid-state imaging device according to (1), in which a current voltage conversion circuit that converts the photocurrent into the voltage signal is further arranged on the detection chip.

(4) The solid-state imaging device according to (3), in which the current voltage conversion circuit includes an N-type transistor having a drain connected to a cathode of the photodiode and a gate and a source commonly connected to a power source, and a connection point of the N-type transistor and the photodiode is connected to an input terminal of the buffer.

(5) The solid-state imaging device according to (3) or (4), in which the current voltage conversion circuit includes a diode having an anode connected co a cathode of the photodiode and a cathode connected to a power source, and a connection point of the diode and the photodiode is connected to an input terminal of the buffer.

(6) The solid-state imaging device according to any of (3) to (5), in which the current voltage conversion circuit includes a first N-type transistor having a gate to which a predetermined bias voltage is applied and a drain connected to a cathode of the photodiode, and a second T-type transistor having a gate connected to a connection point of the photodiode and the first transistor, a drain connected to a source of the first N-type transistor, and a source grounded, and a connection point of the first and second transistors is connected to an input terminal of the buffer.

(7) The solid-state imaging device according to any of (3) to (6), in which the current voltage conversion circuit includes multiple stage loop circuits, and each of the multiple stage loop circuits includes a first N-type transistor and a second N-type transistor having a gate connected to a source of the first N-type transistor and a drain connected to a gate of the first S-type transistor. (8) The solid-state imaging device according to (1), in which a current voltage conversion circuit that converts the photocurrent into the voltage signal and a buffer that corrects and outputs the voltage signal are further arranged on the light receiving chip.

(9) The solid-state imaging device according to (8), in which a first capacitor having one end connected to an output terminal of the buffer is further arranged on the light receiving chip, and an inverter having an input terminal connected to another terminal of the first capacitor and a second capacitor connected to the inverter in parallel are further arranged on the detection chip.

(10) The solid-state imaging device according to (8), in which a subtractor that lowers a level of the voltage signal output from the buffer and a quantizer that quantizes the lowered voltage signal and outputs a quantized lowered voltage signal as the detection signal are further arranged on the light receiving chip.

(11) The solid-state imaging device according to any of (1) to (10), further including:

a signal processing chip that processes the detection. signal.

(12) The solid-state imaging device according to (1), in which a light receiving section on which a predetermined number of photodiodes are arrayed in a two-dimensional lattice is arranged on the light receiving chip, an address event detection circuit that outputs the detection signal is arranged on the detection chip, and the address event detection circuit is commonly connected to a plurality of photodiodes adjacent within the light receiving section.

(13) The solid-state imaging device according to (12), in which a multiplexer that selects any of the phot: currents from the plurality of photodiodes and feeds the photocurrent to the address event detection circuit is further arranged on the detection chip.

(14) The solid-state imaging device according to (12) , in which a multiplexer that selects any of the photocurrents from the plurality of photodiodes and feeds the photocurrent to the address event detection circuit is further arranged on the light receiving chip.

(15) The solid-state imaging device according to any of (1) to (14), further including:

a shield arranged between the light receiving chip and the detection chip.

(16) The solid-state imaging device according to any of (1) to (15), in which the photodiode is arranged on each of a normal pixel and a phase difference pixel, and a part of The photodiode of the phase difference pixel is light-shielded.

(17) The solid-state imaging device according to (1), in which a predetermined number of the photodiodes arrayed in a two-dimensional lattice and a current voltage conversion circuit that converts the photocurrent into the voltage signal are arranged on the light receiving chip, and a plurality of photodiodes adjacent of the predetermined number of photodiodes are commonly connected to the current voltage conversion circuit.

(18) The solid-state imaging device according to (1), in which a quantizer that compares the voltage signal with a plurality of threshold voltages and outputs a signal of a plurality of bits showing a compared result. as the detection signal is arranged on the detection chip.

REFERENCE SIGNS LIST 100 imaging apparatus
110 imaging lens
120 recording section
130 control section.
200 solid-state imaging device
201 light receiving chip
202 detection chip
203 signal processing chip
211, 212, 213, 231, 232, 233, 253, 254 via arrangement section
220 light receiving section
221, 411 photodiode
222 pixel block
223 normal pixel
224 phase difference pixel
240 signal processing circuit
251 row drive circuit
252 column drive circuit
260 address event detection section
261 multiplexer
300 address event detection circuit
310, 413 current voltage conversion circuit
311, 313, 315, 316, 321, 322, 335 to 337, 342 to 345 N-type transistor
312 P-type transistor
314 diode
320, 332, 414 buffer
330 subtractor
331, 333 capacitor
334 switch
340 quantizer
341 comparator
350 transfer circuit
401, 102, 403 shield
412 light shield section
12031 imaging section

The invention claimed is:

1. A solid-state imaging device comprising:
a column drive circuit. arranged on a detection chip;
a plurality of pixels, at least one of the plurality of pixels including:
a photodiode that photoelectrically converts incident light and generates a photocurrent, the photodiode arranged on a light receiving chip,
a pixel circuit that quantizes a voltage signal corresponding to the photocurrent and outputs a quantized voltage signal as a detection signal, a part of the pixel circuit being arranged on the detection chip and being electrically connected to the photodiode arranged on the light receiving chip via the connection section; and
a connection section,
wherein in the pixel circuit, a current voltage conversion circuit that converts the photocurrent into the voltage signal is arranged on the light receiving chip,
the current voltage conversion circuit includes a first N-type transistor having a drain connected to a cathode of the photodiode, a second N-type transistor having a gate connected to the cathode of the photodiode and the drain of the first transistor, and a source grounded, and
a connection point of the first and second N-type transistors is connected to an input terminal of a buffer circuit arranged on the light receiving chip, and an output terminal of the buffer circuit is connected to the part of the pixel circuit via the connection section.

2. The solid-state imaging device of claim 1, wherein the connection section comprises Cu—Cu bonding.

3. The solid-state imaging device of claim 1, further comprising:
a pixel drive circuit arranged on the detection chip.

4. The solid-state imaging device of claim 1, further comprising:
a comparator configured to output a signal.

5. The solid-state imaging device of claim 1, wherein a conductivity of the first transistor and the second transistor is different than a conductivity of a third transistor.

6. The solid-state imaging device of claim 1, wherein a gate of the third transistor is coupled to a line that receives a bias voltage.

7. The solid-state imaging device of claim 1, wherein a source or a drain of the second transistor is configured to receive a power source voltage.

8. The solid-state imaging device of claim 1, further comprising a shield wiring disposed below the photodiode.

9. The solid-state imaging device of claim 1, wherein the buffer circuit is coupled between a current-voltage convertor and a subtractor.

10. A dynamic vision sensor comprising:
a photodiode;
a pixel circuit that quantizes a voltage signal corresponding to a photocurrent and. outputs a quantized voltage signal as a detection signal, the pixel circuit including:
a current voltage conversion circuit including first and second transistors having a first conductivity type, a first terminal of first transistor coupled to the photodiode and a gate of the second transistor, and
a buffer circuit,
a pixel drive circuit; and
a connection section,
wherein the photodiode, the current voltage conversion circuit, and the buffer circuit are arranged on a first substrate,
a part of the pixel circuit and the pixel drive circuit are arranged on a second substrate stacked to the first substrate, and
the part of the pixel circuit is coupled to the buffer circuit via the connection section.

11. The dynamic vision sensor of claim 10, wherein the photodiode photoelectrically converts incident light and generates a photocurrent.

12. The dynamic vision sensor of claim 10, further comprising a detection chip.

13. The dynamic vision sensor of claim 12, further comprising a column drive circuit arranged on the detection chip.

14. The dynamic vision sensor of claim 12, wherein the detection chip comprises the second substrate.

15. The dynamic vision sensor of claim 12, wherein the current voltage conversion circuit converts the photocurrent into the voltage signal.

16. The dynamic vision sensor of claim 10, wherein the current voltage conversion circuit includes a first N-type transistor having a drain connected to a cathode of the photodiode, a second N-type transistor having a gate connected to the cathode of the photodiode and the drain of the first transistor, and a source grounded.

17. The dynamic vision sensor of claim 10, wherein the connection section comprises Cu—Cu bonding.

18. The dynamic vision sensor of claim 10, further comprising a shield wiring between The first substrate and the second substrate.

* * * * *